US012453136B2

(12) United States Patent
Jourba et al.

(10) Patent No.: US 12,453,136 B2
(45) Date of Patent: Oct. 21, 2025

(54) METHOD OF FORMING A DEVICE WITH PLANAR SPLIT GATE NON-VOLATILE MEMORY CELLS, PLANAR HV DEVICES, AND FINFET LOGIC DEVICES ON A SUBSTRATE

(71) Applicant: Silicon Storage Technology, Inc., San Jose, CA (US)

(72) Inventors: Serguei Jourba, Aix en Provence (FR); Catherine Decobert, Pourrieres (FR); Feng Zhou, Fremont, CA (US); Jinho Kim, Saratoga, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 786 days.

(21) Appl. No.: 17/824,812

(22) Filed: May 25, 2022

(65) Prior Publication Data

US 2023/0290864 A1    Sep. 14, 2023

Related U.S. Application Data

(60) Provisional application No. 63/317,810, filed on Mar. 8, 2022.

(51) Int. Cl.
*H10D 30/68* (2025.01)
*H10B 41/27* (2023.01)
(Continued)

(52) U.S. Cl.
CPC ......... *H10D 30/6892* (2025.01); *H10B 41/27* (2023.02); *H10D 30/024* (2025.01);
(Continued)

(58) Field of Classification Search
CPC ........ H10B 41/27; H10B 41/49; H10D 30/01; H10D 30/019–0198; H10D 30/024;
(Continued)

(56) References Cited

U.S. PATENT DOCUMENTS

| 5,242,848 A | 9/1993 | Yeh |
| 6,747,310 B2 | 6/2004 | Fan et al. |

(Continued)

FOREIGN PATENT DOCUMENTS

| TW | 200414549 A | 8/2004 |
| TW | 200605070 A | 2/2006 |

(Continued)

OTHER PUBLICATIONS

PCT Search Report and Written Opinion dated Nov. 11, 2022 corresponding to the related PCT Patent Application No. US2022/032575.

(Continued)

*Primary Examiner* — Cheung Lee
(74) *Attorney, Agent, or Firm* — DLA Piper LLP (US)

(57) ABSTRACT

A method of forming a device on a silicon substrate having first, second and third areas includes recessing an upper substrate surface in the first and third areas, forming an upwardly extending silicon fin in the second area, forming first source, drain and channel regions in the first area, forming second source, drain and channel regions in the fin, forming third source, drain and channel regions in the third area, forming a floating gate over a first portion of the first channel region using a first polysilicon deposition, forming an erase gate over the first source region and a device gate over the third channel region using a second polysilicon deposition, and forming a word line gate over a second (Continued)

portion of the first channel region, a control gate over the floating gate, and a logic gate over the second channel region using a metal deposition.

16 Claims, 20 Drawing Sheets

(51) Int. Cl.
| | |
|---|---|
| *H10D 30/01* | (2025.01) |
| *H10D 30/62* | (2025.01) |
| *H10D 62/13* | (2025.01) |
| *H10D 84/01* | (2025.01) |
| *H10D 84/03* | (2025.01) |

(52) U.S. Cl.
CPC ..... *H10D 30/0411* (2025.01); *H10D 30/6211* (2025.01); *H10D 30/68* (2025.01); *H10D 62/151* (2025.01); *H10D 84/0128* (2025.01); *H10D 84/013* (2025.01); *H10D 84/0158* (2025.01); *H10D 84/038* (2025.01)

(58) Field of Classification Search
CPC ........... H10D 30/0411; H10D 30/0415; H10D 30/501–509; H10D 30/6211; H10D 30/6215; H10D 30/6217; H10D 30/68; H10D 30/681; H10D 30/6892; H10D 30/701; H10D 62/151; H10D 64/035; H10D 84/01; H10D 84/0128; H10D 84/013; H10D 84/0158; H10D 84/038; H10D 84/834

See application file for complete search history.

(56) References Cited

U.S. PATENT DOCUMENTS

| | | | |
|---|---|---|---|
| 6,861,698 B2 | 3/2005 | Wang | |
| 7,046,552 B2 | 5/2006 | Chen | |
| 7,119,396 B2 | 10/2006 | Chen | |
| 7,151,042 B2 | 12/2006 | Jeng et al. | |
| 7,315,056 B2 | 1/2008 | Klinger et al. | |
| 7,326,614 B2 | 2/2008 | Kianian | |
| 7,410,913 B2 | 8/2008 | Lee | |
| 7,423,310 B2 | 9/2008 | Verhoeven | |
| 7,439,133 B2 | 10/2008 | Chou | |
| 7,834,390 B2 | 11/2010 | Nagai | |
| 7,868,375 B2 | 1/2011 | Liu et al. | |
| 7,927,994 B1 | 4/2011 | Liu et al. | |
| 8,008,702 B2 | 8/2011 | Wang et al. | |
| 8,101,477 B1 | 1/2012 | Power | |
| 8,138,524 B2 | 3/2012 | Kotov et al. | |
| 8,173,514 B2 | 5/2012 | Ogura | |
| 8,334,560 B2 | 12/2012 | Pan | |
| 8,461,640 B2 | 6/2013 | Hu | |
| 8,664,059 B2 | 3/2014 | Dornel et al. | |
| 8,669,607 B1 | 3/2014 | Tsair | |
| 8,878,281 B2 | 11/2014 | Huang | |
| 9,082,865 B2 | 7/2015 | Yu | |
| 9,093,546 B2 | 7/2015 | Uozaki et al. | |
| 9,123,822 B2 | 9/2015 | Yoo et al. | |
| 9,219,134 B2 | 12/2015 | Fukumoto | |
| 9,230,977 B2 | 1/2016 | Wu | |
| 9,276,005 B1 | 3/2016 | Zhou | |
| 9,276,006 B1 | 3/2016 | Zhou et al. | |
| 9,287,282 B2 | 3/2016 | Hsieh | |
| 9,349,741 B2 | 5/2016 | Liu et al. | |
| 9,368,605 B2 | 6/2016 | Lusetzky | |
| 9,379,121 B1 | 6/2016 | Chen et al. | |
| 9,431,257 B2 | 8/2016 | Liu et al. | |
| 9,431,407 B2 | 8/2016 | Su et al. | |
| 9,472,562 B1 | 10/2016 | Liu | |
| 9,484,261 B2 | 11/2016 | Su et al. | |
| 9,496,369 B2 | 11/2016 | Wu et al. | |
| 9,634,019 B1 | 4/2017 | Zhou et al. | |
| 9,793,280 B2 | 10/2017 | Chen | |
| 9,793,281 B2 | 10/2017 | Su et al. | |
| 9,972,630 B2 | 5/2018 | Su | |
| 9,985,042 B2 | 5/2018 | Su | |
| 10,249,631 B2 | 4/2019 | Su | |
| 10,312,247 B1 | 6/2019 | Jourba | |
| 10,468,428 B1 | 11/2019 | Zhou | |
| 10,535,671 B2 | 1/2020 | Liu | |
| 10,714,634 B2 | 7/2020 | Yang et al. | |
| 10,727,240 B2 | 7/2020 | Jourba | |
| 10,797,142 B2 | 10/2020 | Jourba | |
| 10,937,794 B2 | 3/2021 | Zhou | |
| 2004/0065917 A1 | 4/2004 | Fan | |
| 2005/0186741 A1 | 8/2005 | Roizin | |
| 2009/0039410 A1 | 2/2009 | Liu | |
| 2009/0065873 A1 | 3/2009 | Park | |
| 2009/0166708 A1 | 7/2009 | Io | |
| 2009/0215243 A1 | 8/2009 | Ogura | |
| 2009/0239351 A1 | 9/2009 | Aloni | |
| 2009/0321810 A1 | 12/2009 | Ryu et al. | |
| 2010/0054043 A1 | 3/2010 | Liu | |
| 2010/0207174 A1 | 8/2010 | Tsai | |
| 2011/0049603 A1 | 3/2011 | Pan | |
| 2012/0299056 A1 | 11/2012 | Arai | |
| 2013/0032872 A1 | 2/2013 | Kotov et al. | |
| 2013/0171814 A1 | 7/2013 | Torii | |
| 2013/0207174 A1 | 8/2013 | Wang | |
| 2013/0242659 A1 | 9/2013 | Yu | |
| 2013/0313626 A1 | 11/2013 | Huang | |
| 2014/0015030 A1 | 1/2014 | Han | |
| 2014/0097482 A1 | 4/2014 | Tokunaga et al. | |
| 2014/0264538 A1 | 9/2014 | Yu | |
| 2015/0072489 A1 | 3/2015 | Baker, Jr. | |
| 2015/0084111 A1 | 3/2015 | Wu | |
| 2015/0137207 A1 | 5/2015 | Chuang | |
| 2015/0171101 A1 | 6/2015 | Ishida | |
| 2015/0171102 A1 | 6/2015 | Ishida | |
| 2015/0171103 A1 | 6/2015 | Ishida | |
| 2015/0214237 A1 | 7/2015 | Hsieh | |
| 2015/0263010 A1 | 9/2015 | Chuang | |
| 2016/0020219 A1 | 1/2016 | Chuang | |
| 2016/0043095 A1 | 2/2016 | Yang | |
| 2016/0126327 A1 | 5/2016 | Chen | |
| 2016/0148944 A1 | 5/2016 | Yu | |
| 2016/0163722 A1 | 6/2016 | Chang | |
| 2016/0181266 A1 | 6/2016 | Chuang | |
| 2016/0218110 A1 | 7/2016 | Yang | |
| 2016/0260728 A1 | 9/2016 | Chen | |
| 2017/0117372 A1 | 4/2017 | Li | |
| 2017/0125603 A1 | 5/2017 | Zhou | |
| 2017/0345840 A1 | 11/2017 | Su | |
| 2018/0151580 A1 | 5/2018 | Wu | |
| 2018/0316765 A1 | 11/2018 | Lin | |
| 2019/0172942 A1 | 6/2019 | Yang | |
| 2020/0020601 A1 | 1/2020 | Lin | |
| 2021/0193671 A1 | 6/2021 | Jourba et al. | |

FOREIGN PATENT DOCUMENTS

| | | |
|---|---|---|
| TW | 200723543 | 6/2007 |
| TW | 201338101 | 9/2013 |
| TW | 201813085 | 4/2018 |
| WO | 2017 0204937 | 11/2017 |

OTHER PUBLICATIONS

Chandra Zefanya, et al., "Split-Gate Flash Memory: from Planar to 3D," 2021 International Symposium on Electronic and Smart Devices (ISESD), IEEE, Jun. 29, 2021, pp. 1-5. (Abstract Only).

Taiwanese Office Action mailed on Dec. 5, 2023 corresponding to the related Taiwanese Patent Application No. 112104492.

Chen, et al., "Metal Floating Gate Memory Device With $SiO_2/HfO_2$ Dual-Layer As Engineered Tunneling Barrier," IEEE Electron Device Letters, vol. 35, No. 7, pp. 744-746, Jul. 2014.

Blomme, et al., "Hybrid Floating Gate Cell For Sub-20-nm NAND Flash Memory Technology," IEEE Electron Device Letters, vol. 33, No. 3, pp. 333-335, Mar. 2012.

(56) References Cited

OTHER PUBLICATIONS

Jayanti, et al., "Investigation Of Thermal Stability Of High-k Interpoly Dielectrics In TaN Metal Floating Gate Memory Structures," Dept. of Electrical and Computer Engineering, North Carolina State University, email sjayant2@ncsu.edu, 4 pages.
Raghunathan, et al., "Investigation Of Ballistic Current In Scaled Floating-gate NAND Flash And A Solution," Dept. of Electrical Engineering, Stanford University, Intel Corporation, email rshyam@stanford.edu, 4 pages.
Breuil, et al., "Optimization of Ru Based Hybrid Floating Gate For Planar NAND Flash," IEEE, pp. 101-104, 2015.
Taiwanese Office Action dated Sep. 3, 2021 corresponding to Taiwanese Patent Application No. 109139860.
Chan et al., "Metal Control Gate for Sub-30nm Floating Gate NAND Memory," IEEE, 2008, pp. 1-4.
European Examination Report mailed on Jul. 16, 2025 corresponding to the related European Patent Application No. 22 743 965.0.

METHOD OF FORMING A DEVICE WITH PLANAR SPLIT GATE NON-VOLATILE MEMORY CELLS, PLANAR HV DEVICES, AND FINFET LOGIC DEVICES ON A SUBSTRATE

RELATED APPLICATIONS

This application claims the benefit of U.S. Provisional Application No. 63/317,810, filed Mar. 8, 2022, and which is incorporated herein by reference.

TECHNICAL FIELD

The present disclosure relates to a method of integration of non-volatile flash memory and high voltage transistors with low voltage FinFET transistors.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. It is also known to form logic devices (i.e., low voltage and high voltage logic devices) on the same silicon chip as the memory cells, and in doing so share some of the processing steps for forming portions of both the memory cells and logic devices (e.g. forming gates for both memory cells and logic devices using the same polysilicon deposition process). However, other processing steps in forming the memory cells can adversely affect the previously fabricated logic devices, and vice versa, so it often can be difficult and complex to form both types of devices on the same wafer.

To solve problems with reduced channel widths by shrinking lithography size, FinFET types of structures have been proposed for memory cell structures. In a FinFET type of structure, a fin shaped member of semiconductor material connects the source to the drain regions. The fin shaped member has a top surface and two side surfaces. Current from the source to the drain regions can then flow along the top surface as well as the two side surfaces of the fin shaped member. Thus, the effective width of the channel region is increased, thereby increasing the current flow. However, the effective width of the channel region is increased without sacrificing more semiconductor real estate by "folding" the channel region into two side surfaces, thereby reducing the "footprint" of the channel region. Non-volatile memory cells using such FinFETs have been disclosed. Some examples of prior art FinFET non-volatile memory structures include U.S. Pat. Nos. 7,423,310, 7,410,913 and 8,461,640, the entire contents of each of which is incorporated herein by reference. What these prior art references do not contemplate is a FinFET type configuration for logic devices formed on the same wafer substrate as both non-volatile memory cells and high voltage transistor devices, both of a non-FinFET type configuration.

U.S. Pat. Nos. 9,972,630 and 10,249,631, the entire contents of each of which is incorporated herein by reference, disclose a memory device with FinFET type logic devices and non-FinFET memory cells. However, these patents fail to contemplate the contemporaneous formation of high voltage transistor devices of a non-FinFET type configuration.

BRIEF SUMMARY OF THE INVENTION

The aforementioned problems and needs are addressed by method of forming a device, comprising:

providing a substrate of silicon having first, second and third areas;

recessing an upper surface of the substrate in the first area and an upper surface of the substrate in third area, relative to an upper surface of the substrate in the second area;

removing portions of the substrate in the second area to form an upwardly extending fin of silicon having a pair of side surfaces extending up and terminating at a top surface;

forming a first source region and a first drain region in the first area, wherein the first source region and the first drain region define a first channel region of the substrate extending there between;

forming a second source region and a second drain region in the fin of silicon to define a second channel region of the substrate extending there between along the top surface and the pair of side surfaces of the fin of silicon;

forming a third source region and a third drain region in the third area, wherein the third source region and the third drain region define a third channel region of the substrate extending there between;

forming a floating gate disposed over and insulated from a first portion of the first channel region of the substrate using a first polysilicon deposition;

forming an erase gate disposed over and insulated from the first source region and a device gate disposed over and insulated from the third channel region of the substrate using a second polysilicon deposition different from the first polysilicon deposition; and forming a word line gate disposed over and insulated from a second portion of the first channel region, a control gate disposed over and insulated from the floating gate, and a logic gate disposed over and insulated from the second channel region of the substrate, using a metal deposition.

A device, comprising:

a substrate of silicon having first, second and third areas, wherein:
  an upper surface in the first area is planar,
  an upper surface in the third area is planar,
  an upper surface in the second area includes an upwardly extending fin of silicon that includes a pair of side surfaces extending up and terminating at a top surface, and
  the upper surface in the first area and the upper surface in the third area are recessed below the top surface of the fin of silicon;

a memory cell in the first area, comprising:
  first source and first drain regions formed in the first area with a first channel region of the substrate extending there between,
  a floating gate of polysilicon disposed over and insulated from a first portion of the first channel region,
  a word line gate of metal disposed over and insulated from a second portion of the first channel region,
  a control gate of metal disposed vertically over and insulated from a top surface of the floating gate, the control gate of metal is disposed laterally adjacent to and insulated from a pair of side surfaces of the floating gate, such that the control gate of metal wraps around the top surface and the pair of side surfaces of the floating gate, and
  an erase gate of polysilicon disposed over and insulated from the first source region;

a high voltage device in the third area, comprising:

third source and third drain regions formed in the third area with a third channel region of the substrate extending there between, and a device gate of polysilicon disposed over and insulated from the third channel region; and a logic device in the second area, comprising:

second source and second drain regions formed in the fin of silicon with a second channel region of the substrate extending there between along the top surface and the pair of side surfaces of the fin of silicon, and a logic gate disposed vertically over and insulated from the top surface of the fin of silicon, the logic gate disposed laterally adjacent to and insulated from the pair of side surfaces of the fin of silicon, such that the logic gate wraps around the top surface and the pair of side surfaces of the fin of silicon.

Other objects and features of the present disclosure will become apparent by a review of the specification, claims and appended figures.

DETAILED DESCRIPTION OF THE INVENTION

Figure 1A:
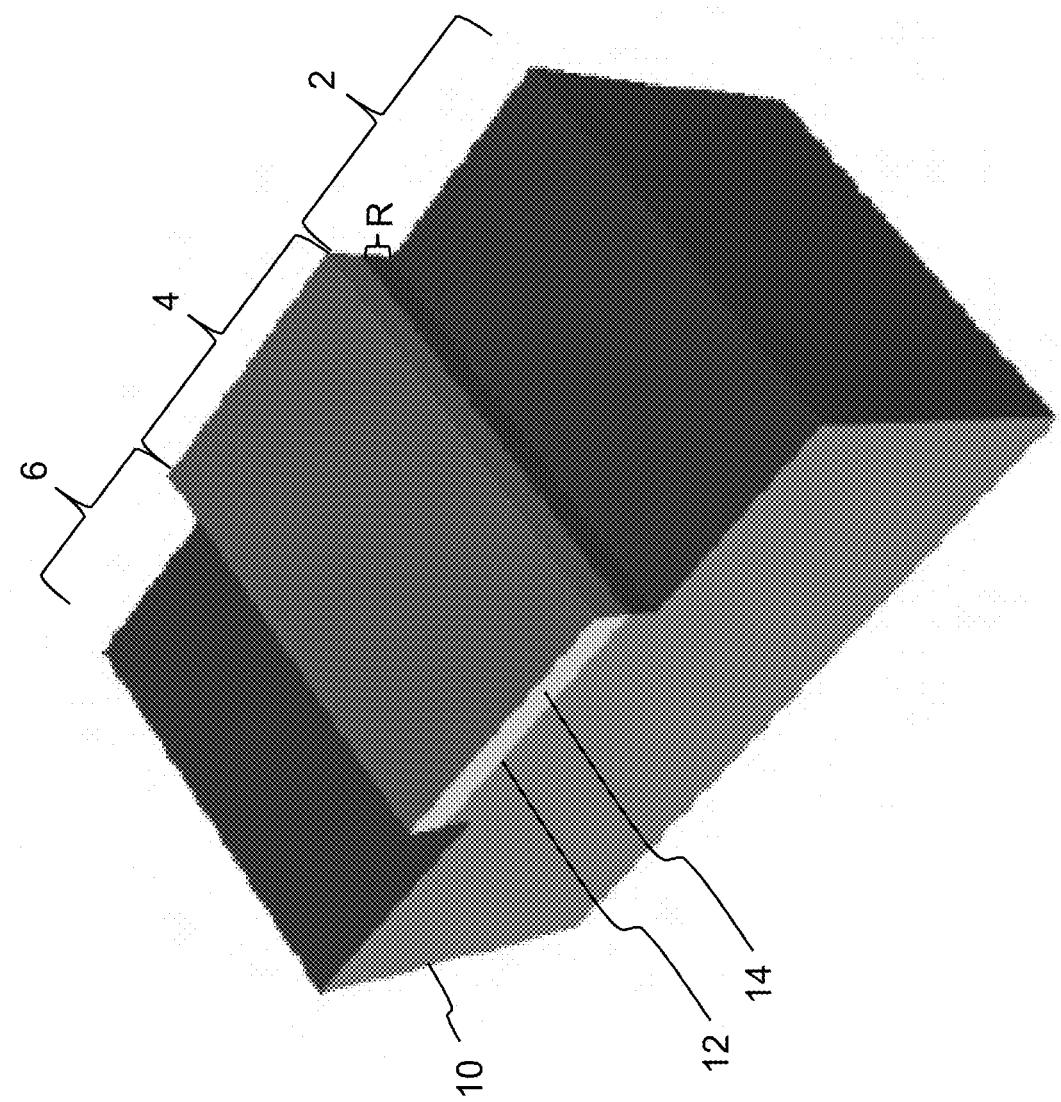
FIGS. 1A-1R are perspective cross sectional views showing steps in forming non-volatile memory cells, HV devices, and logic devices on a semiconductor substrate in accordance with the present examples.
Figure 1B:
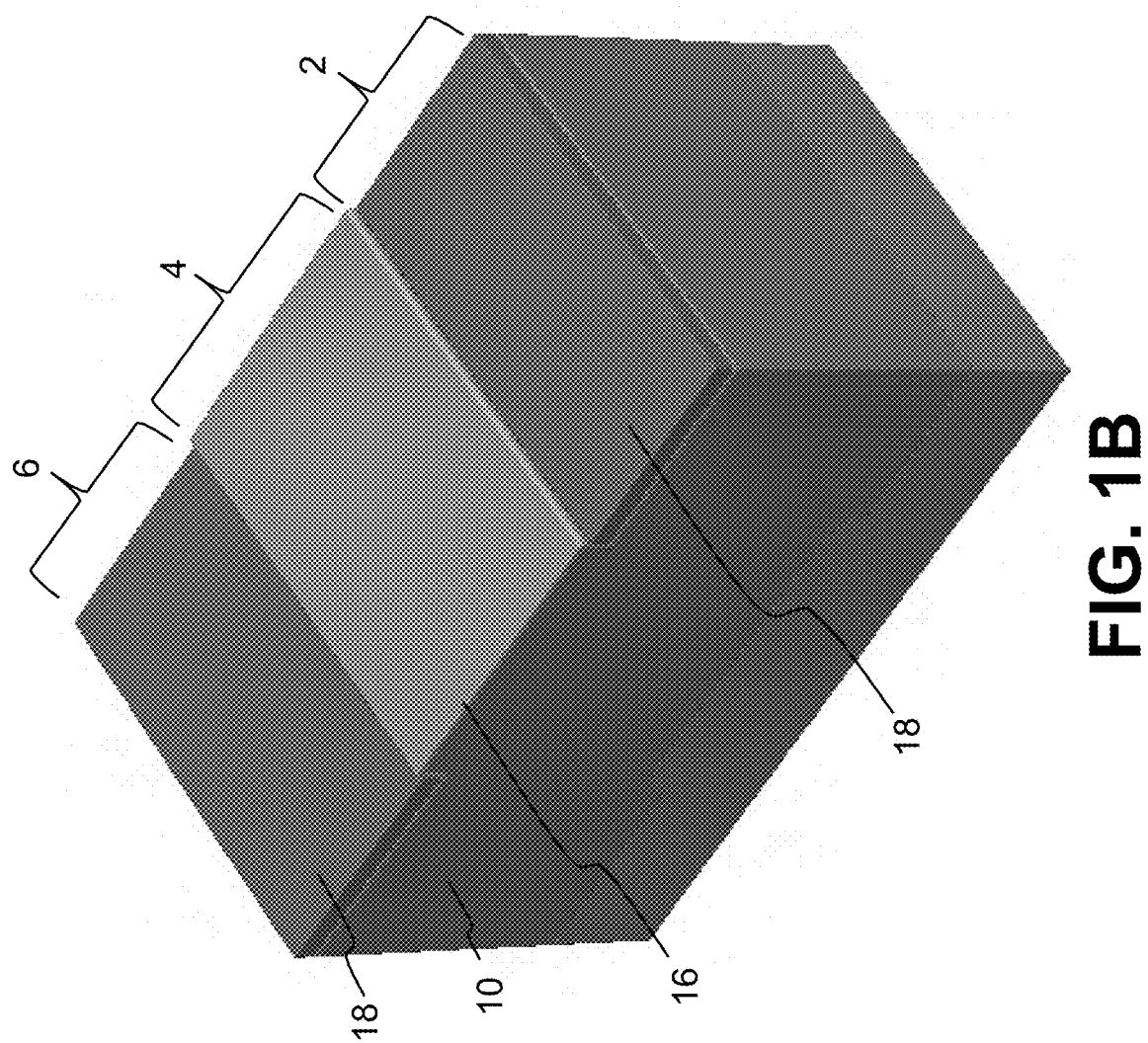
Figure 1C:
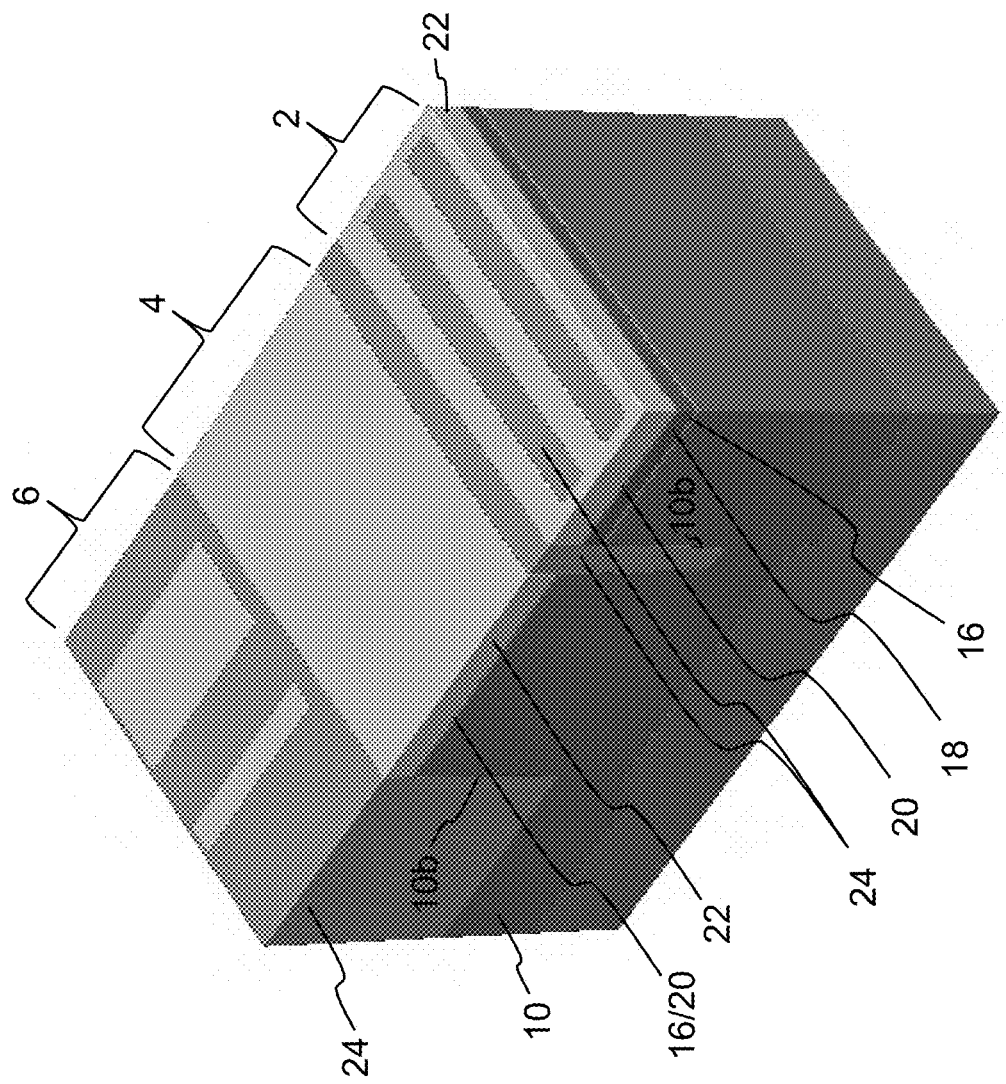
Figure 1D:
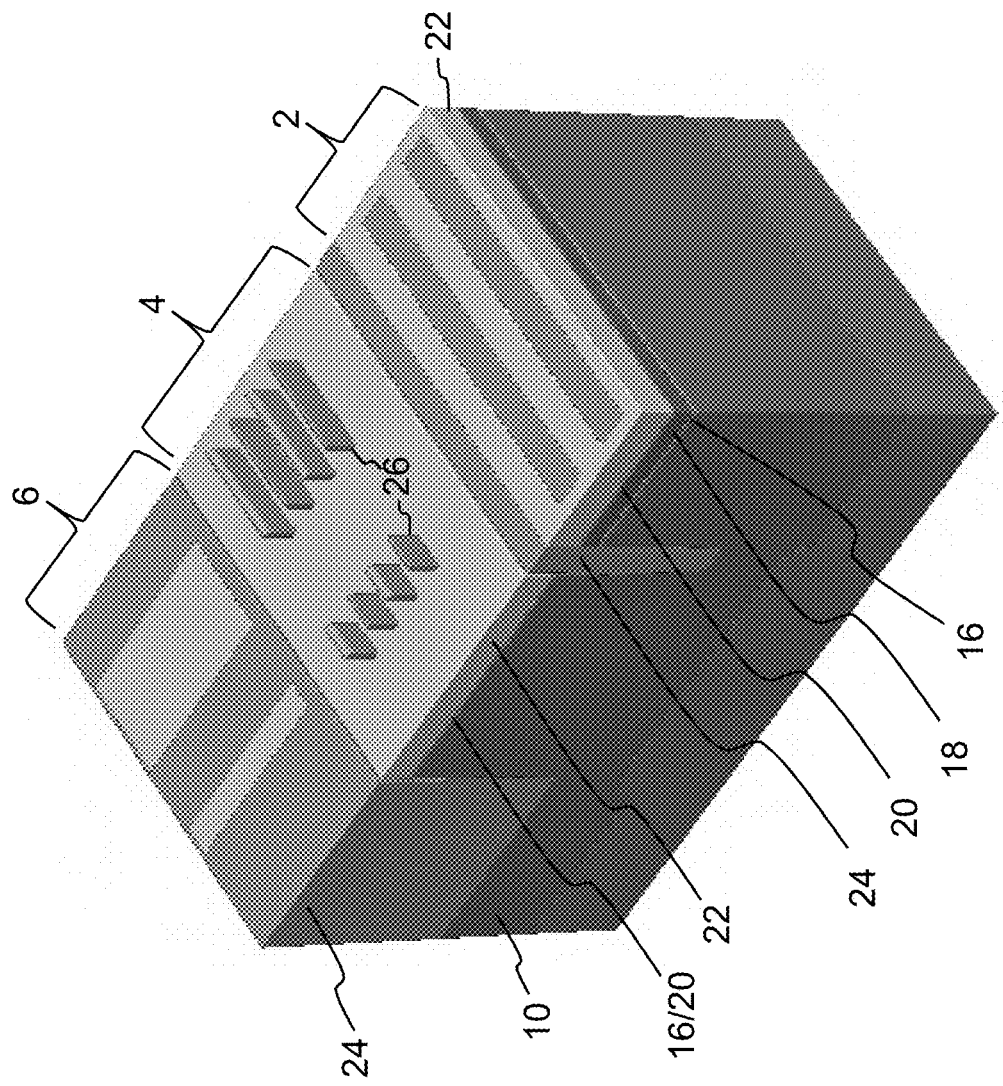
Figure 1E:
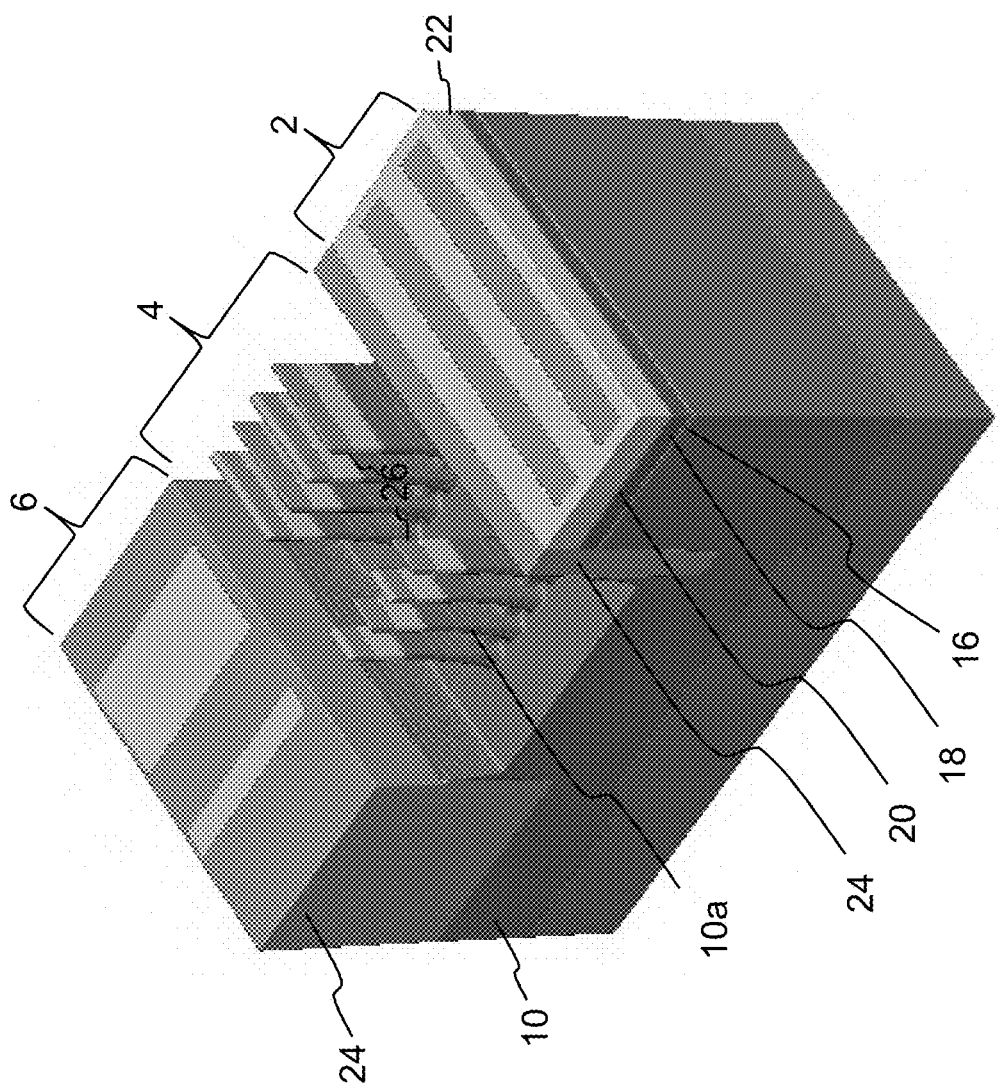
Figure 1F:
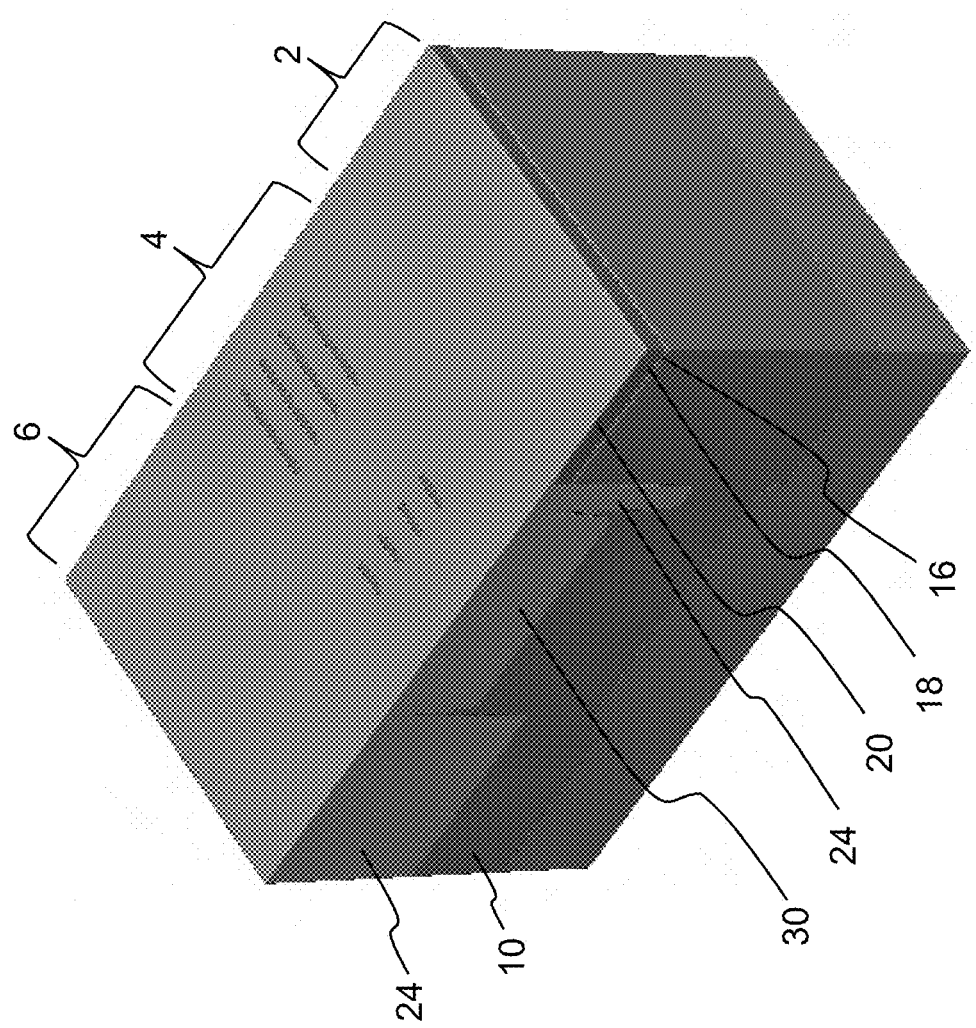
Figure 1G:
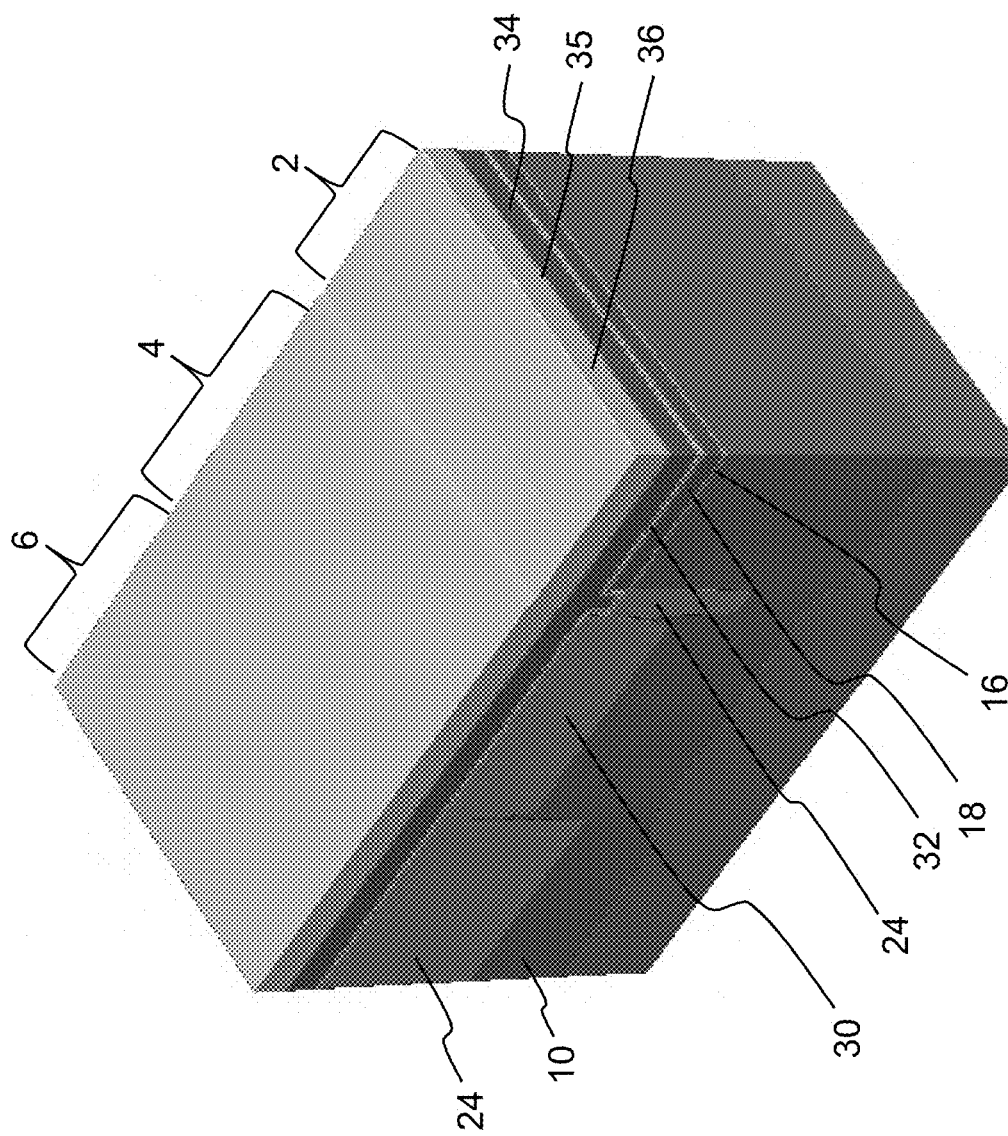
Figure 1H:
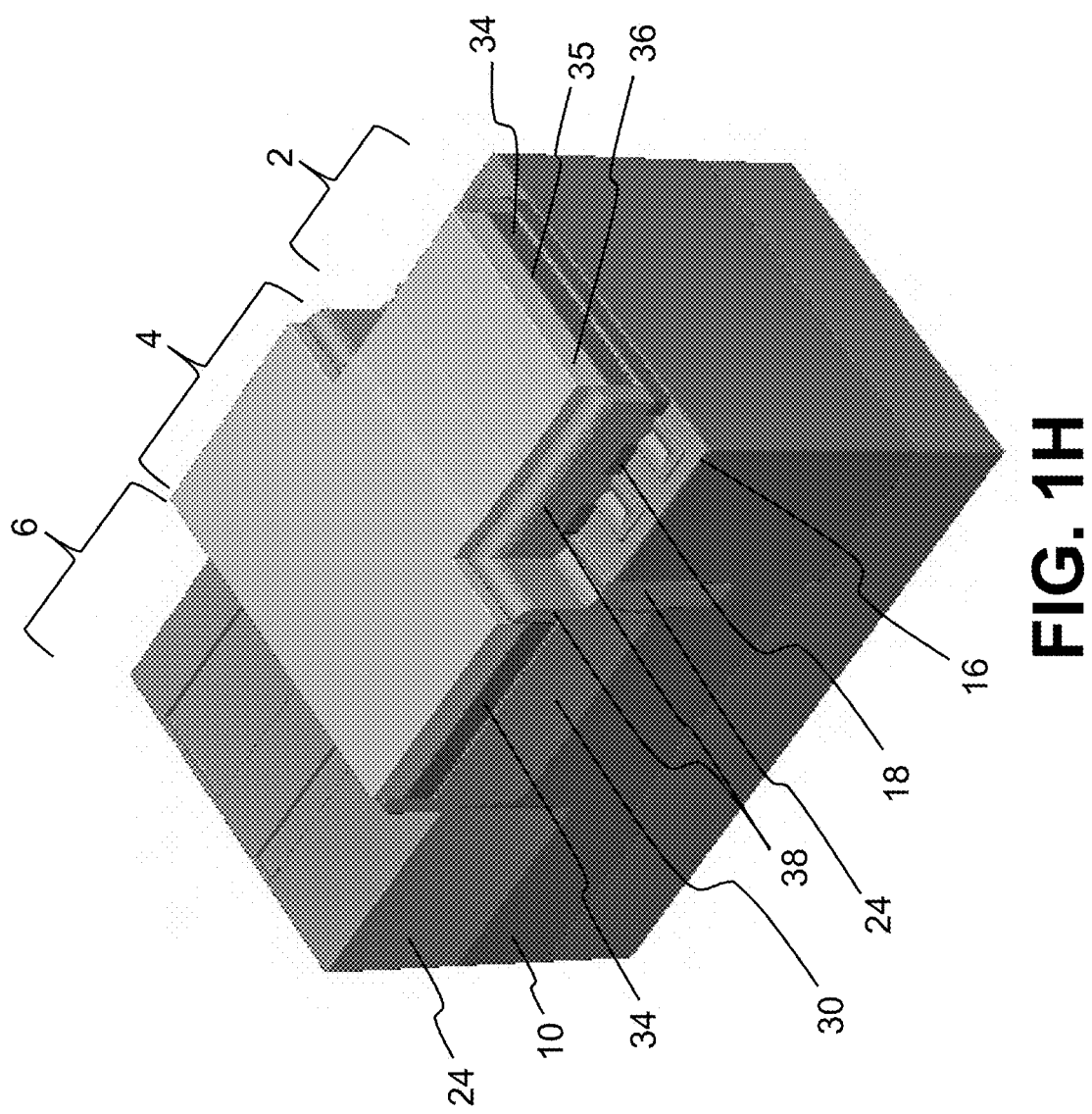
Figure 1I:
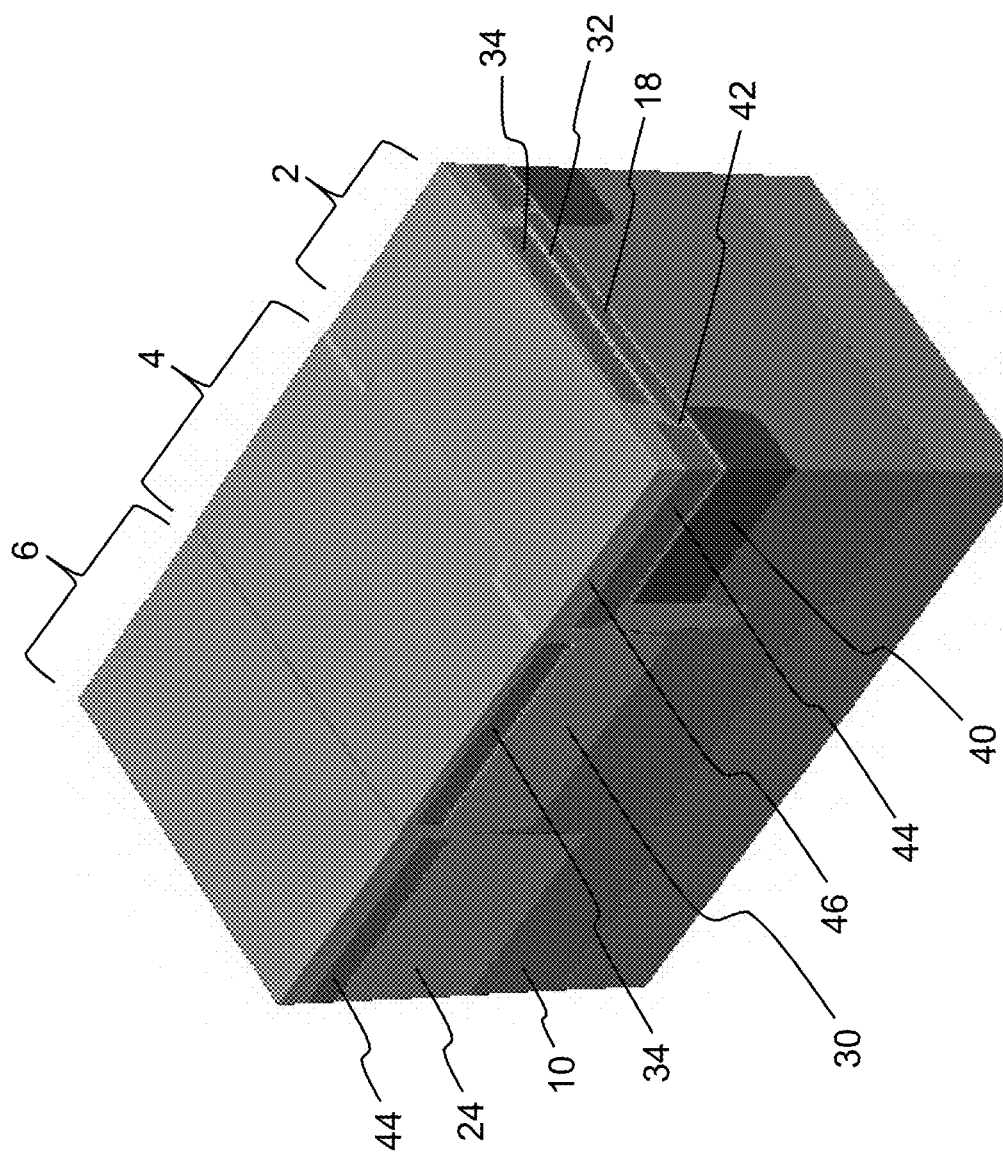
Figure 1J:
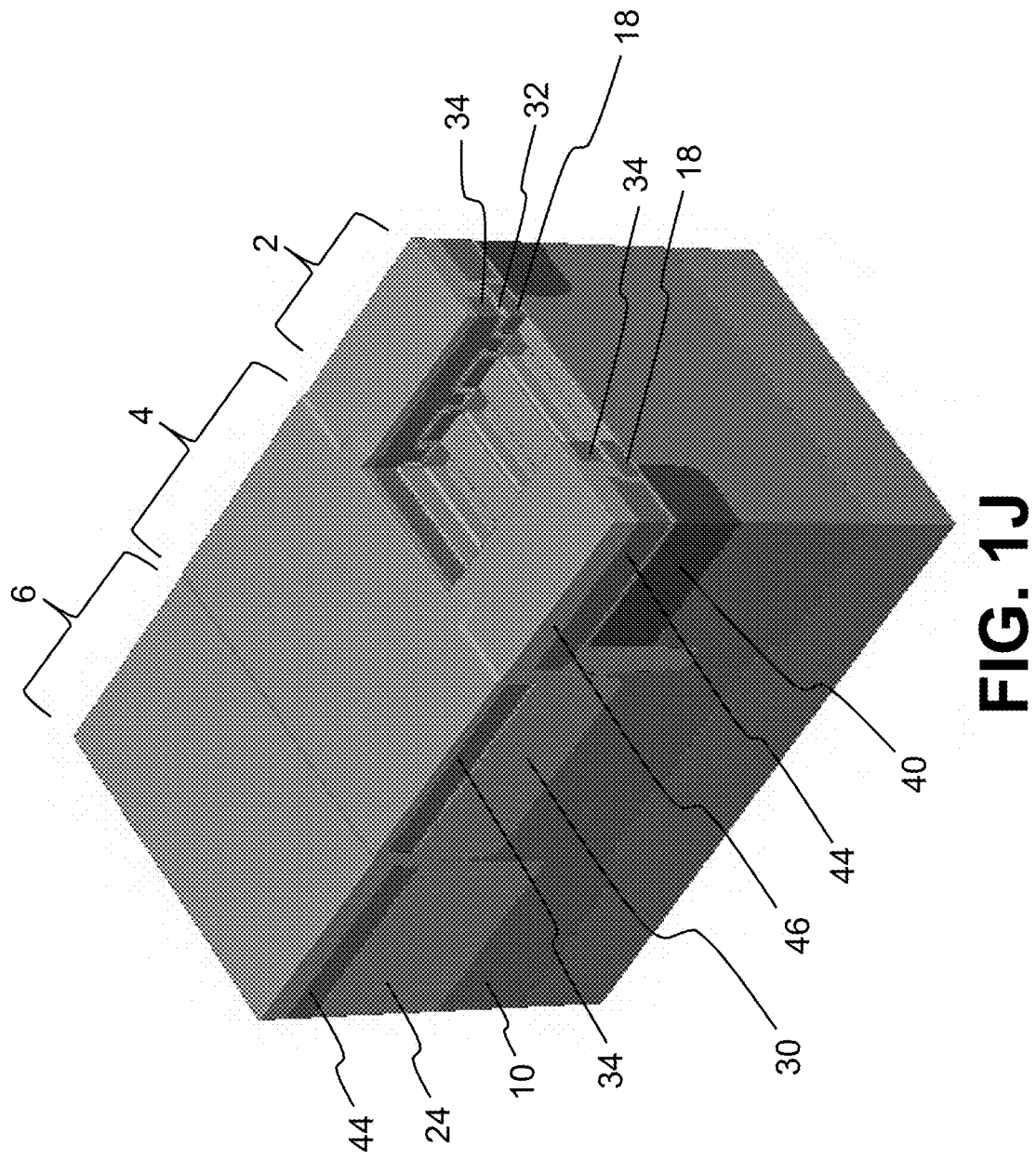
Figure 1K:
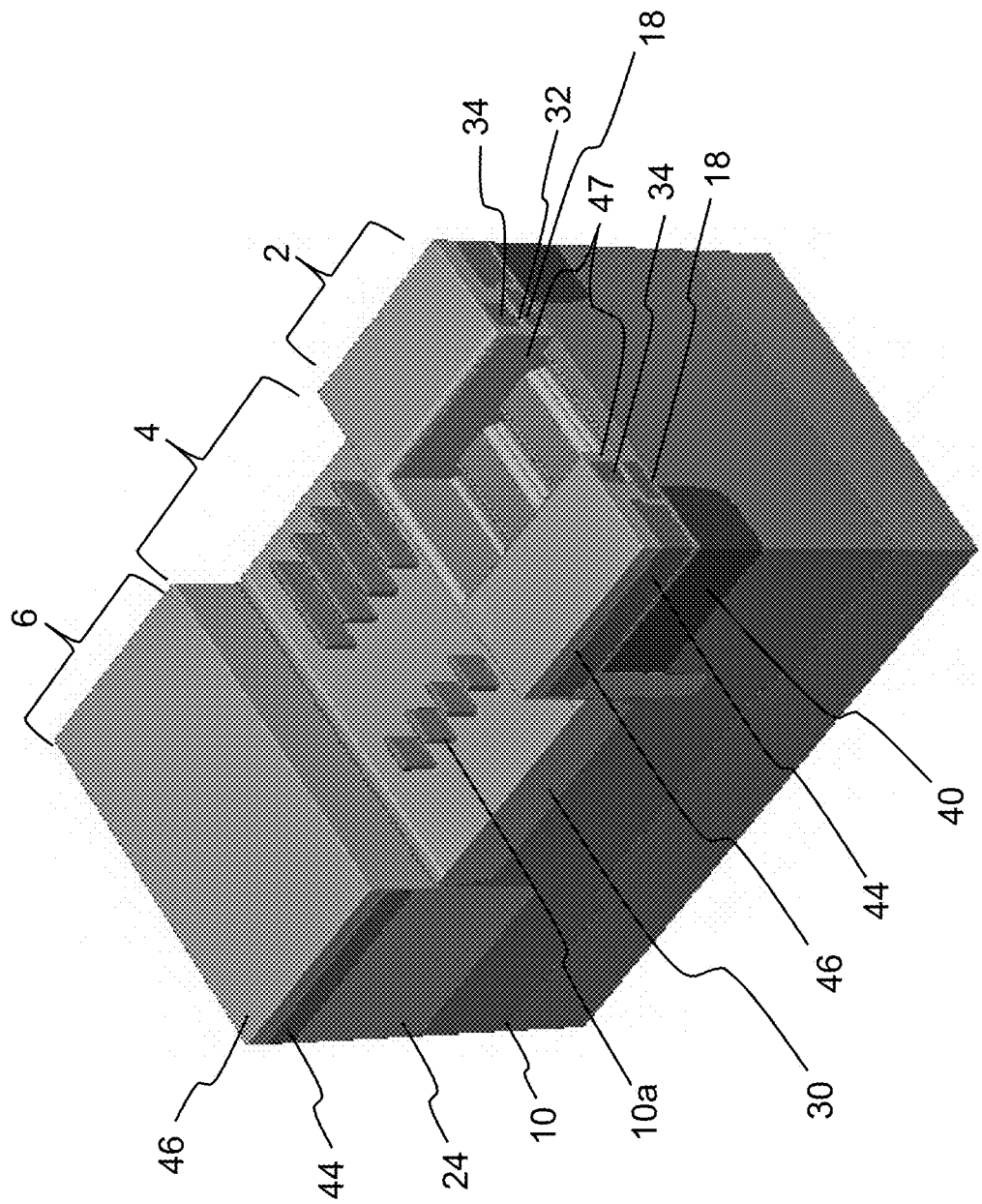
Figure 1L:
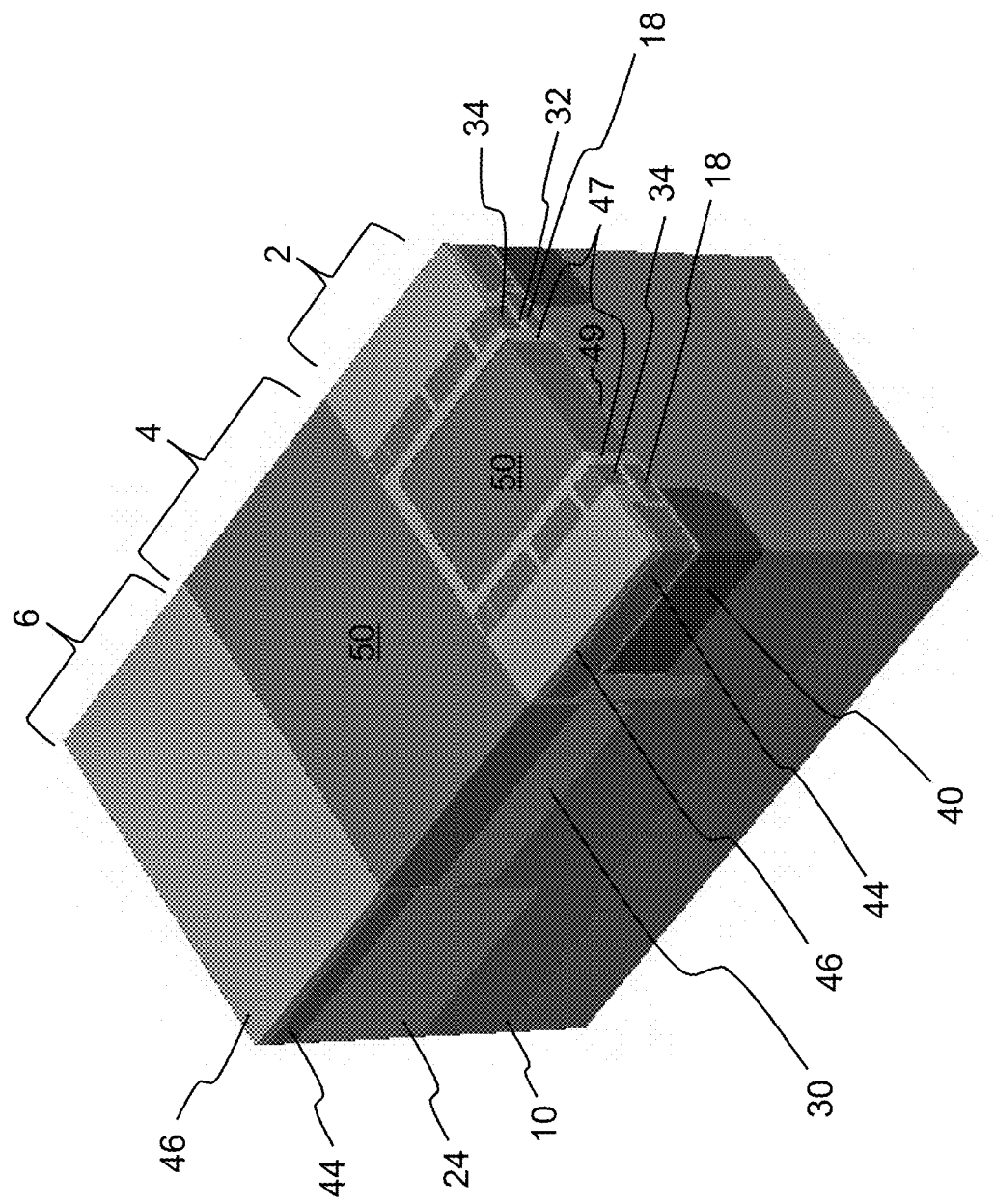
Figure 1M:
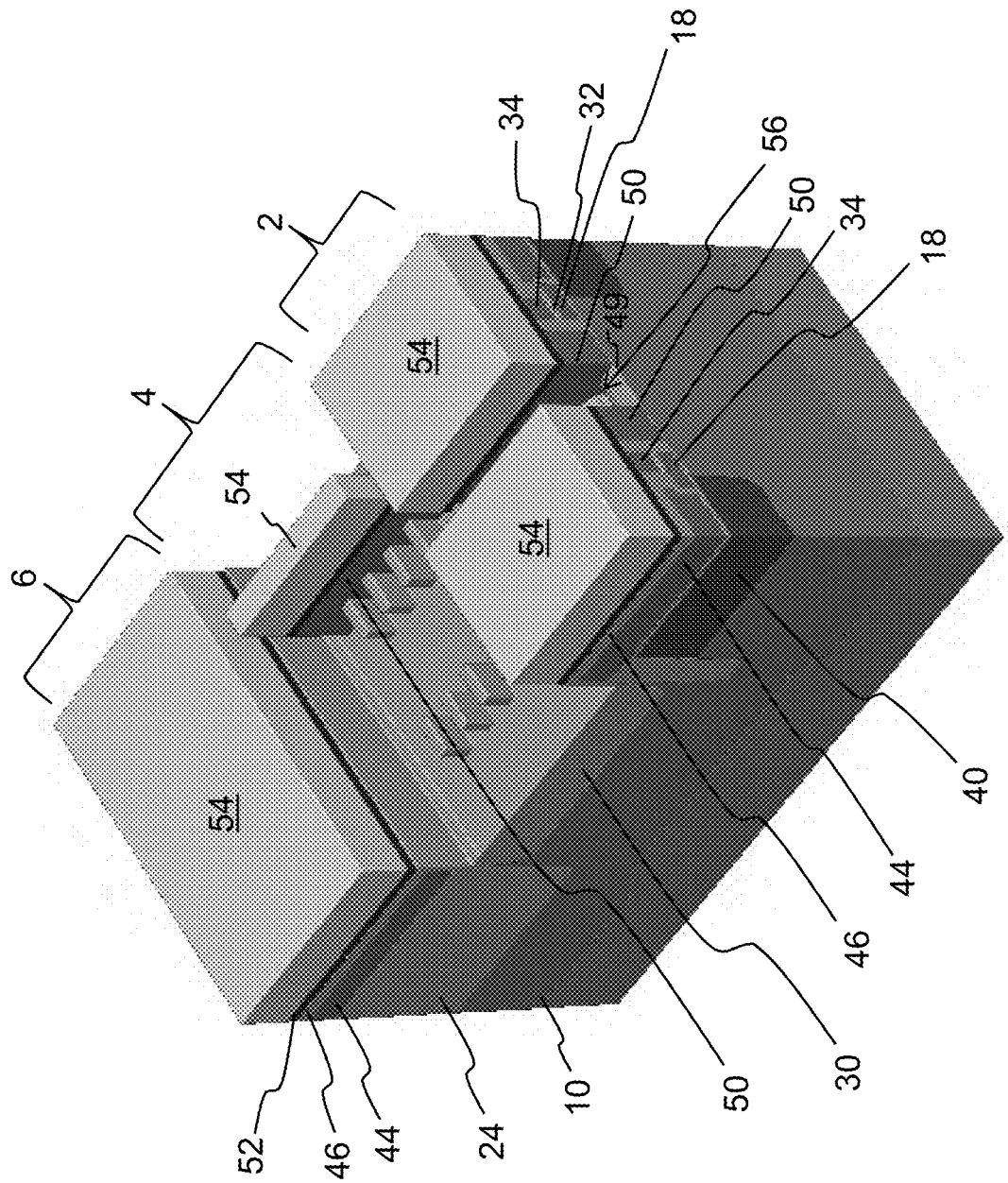
Figure 1N:
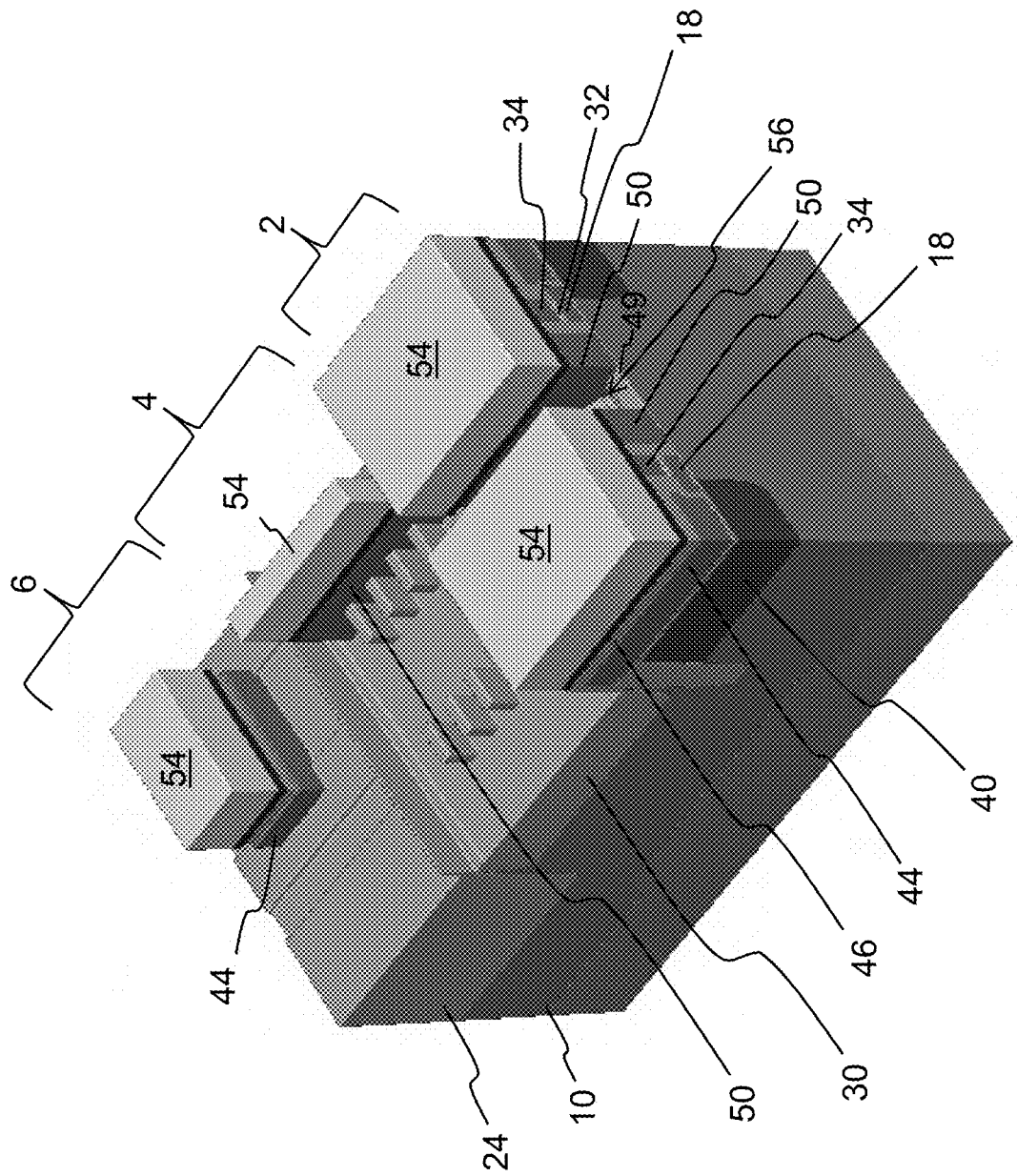
Figure 10:
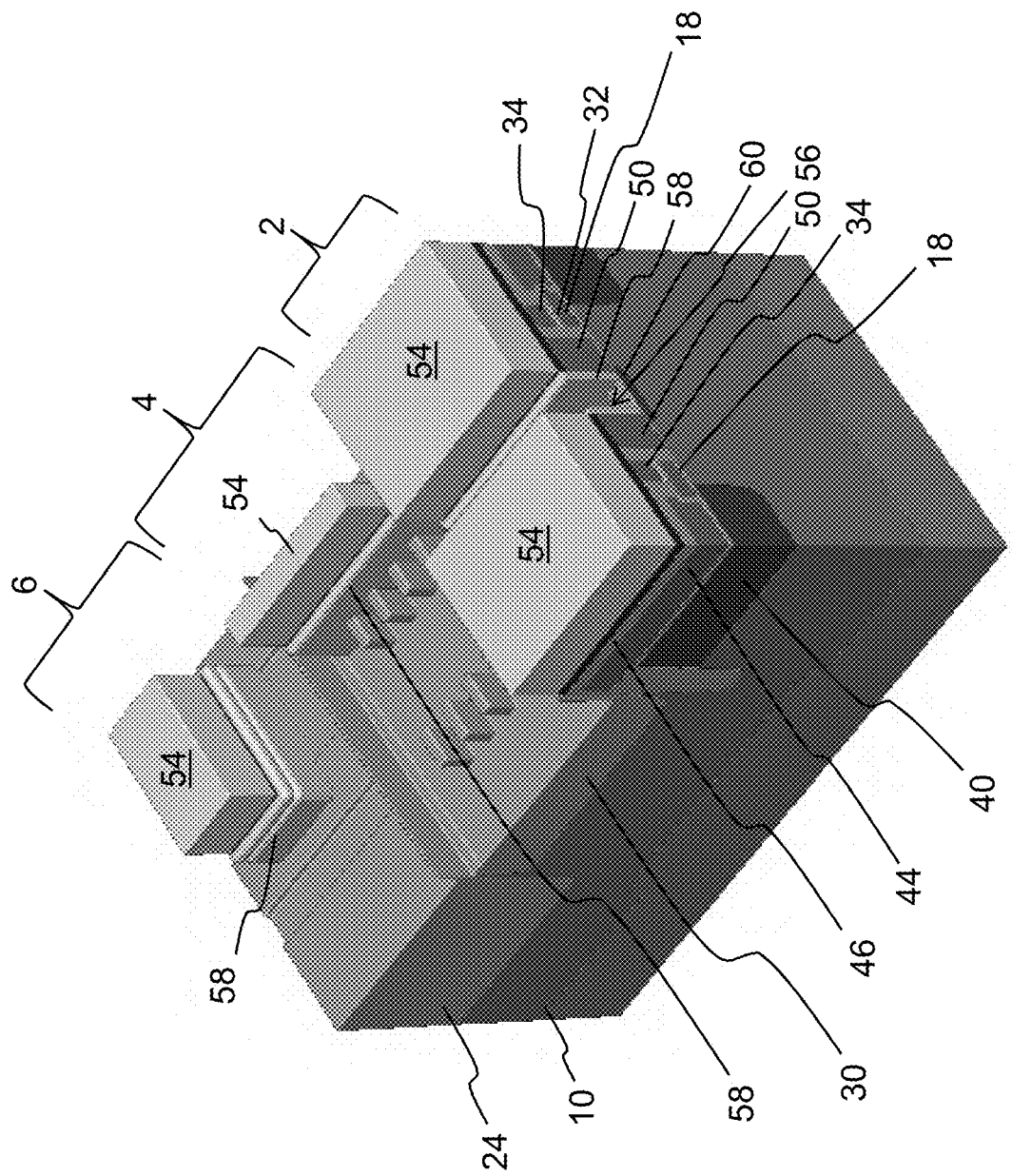
Figure 1P:
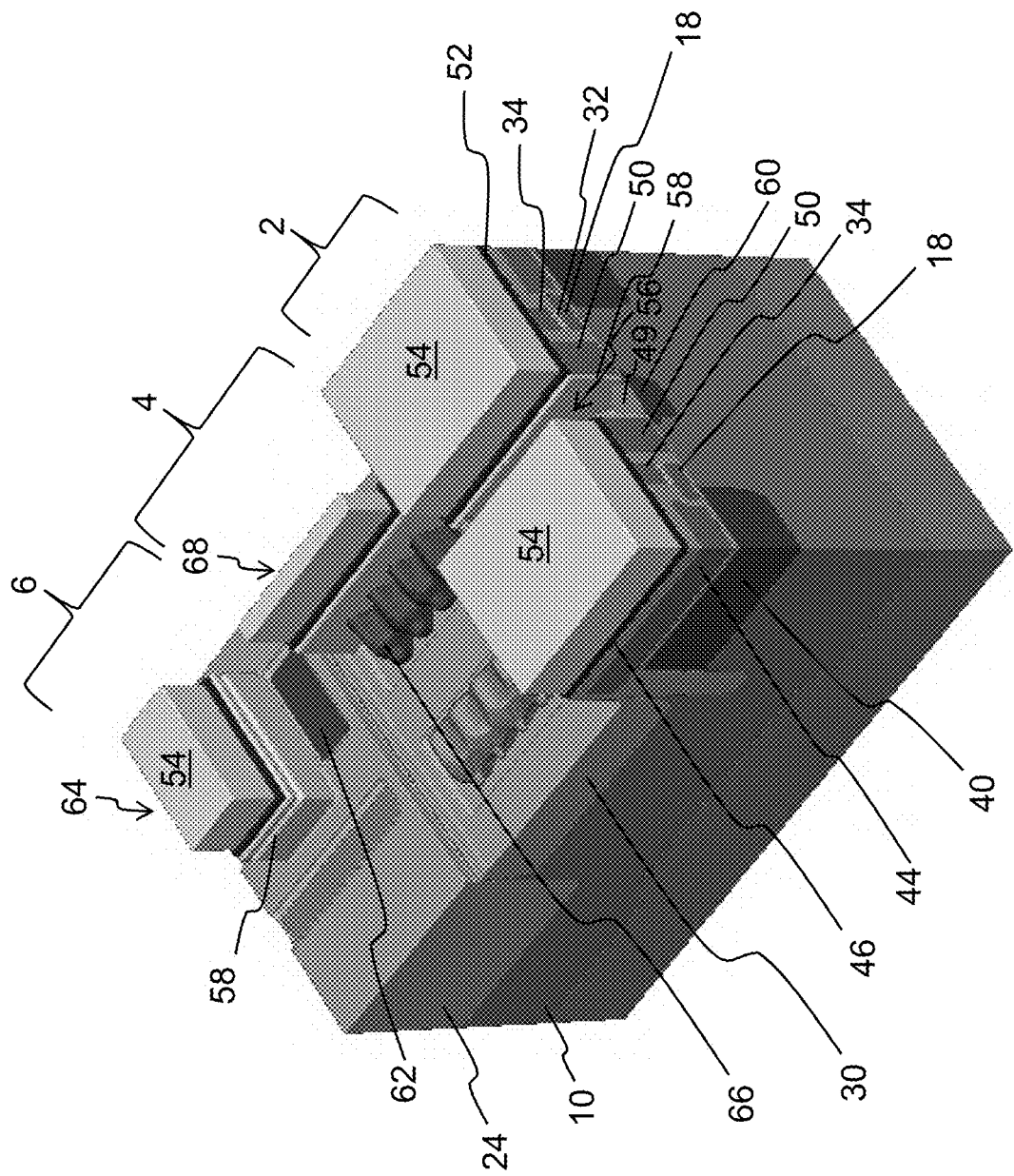
Figure 1Q:
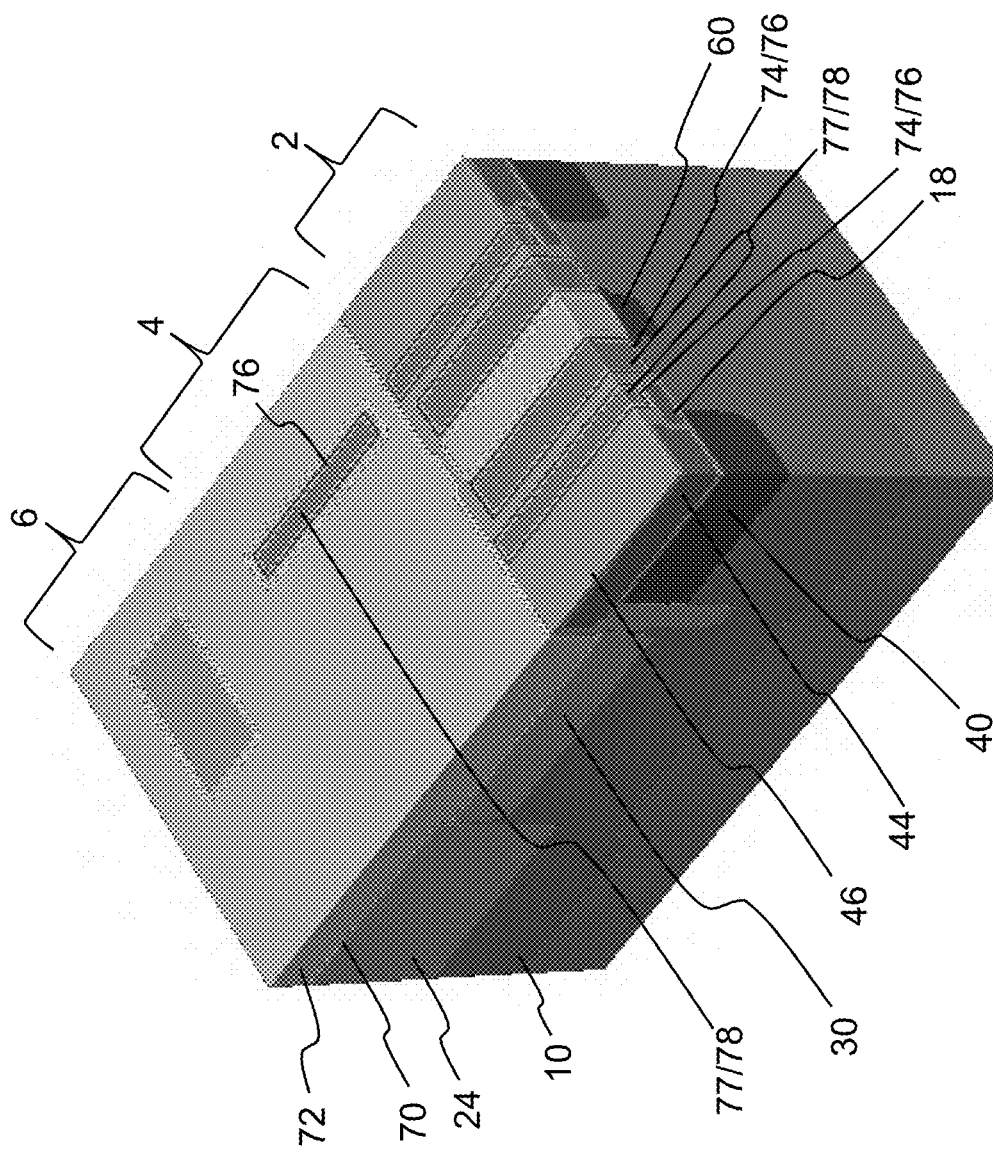
Figure 1R:
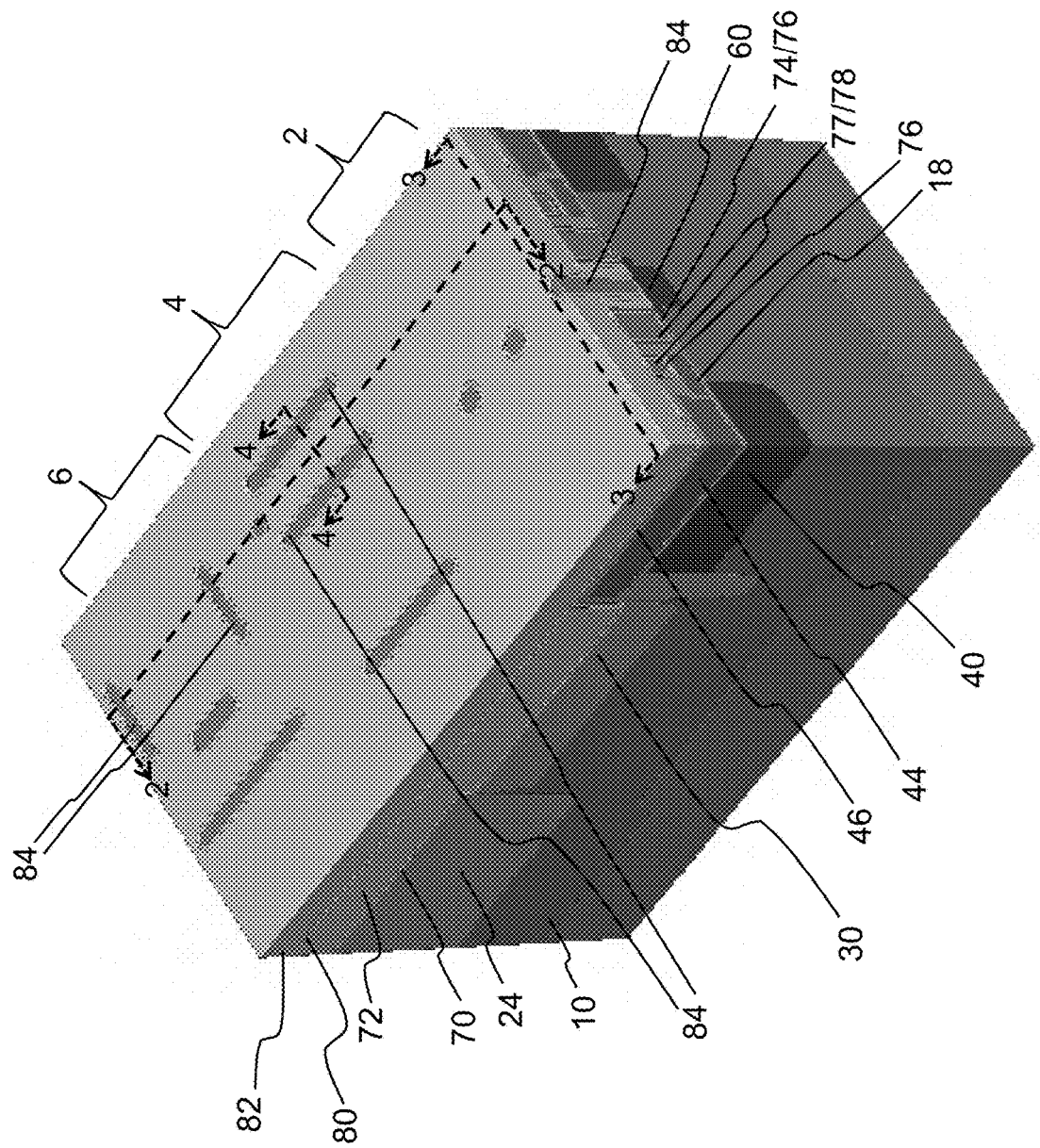

Referring to FIGS. 1A-1R there are shown perspective cross-sectional views of the steps in the process of making pairs of memory cells in a memory cell area (also referred to as MC area or first area) 2 of a semiconductor wafer substrate (also referred to as substrate) 10, logic devices in a logic device area (also referred to as logic area or second area) 4 of the substrate 10, and high voltage transistor devices in a HV device area (also referred to as HV area or third area) 6 of the substrate 10.

The process begins by recessing the upper surface of the substrate by forming a layer of silicon dioxide (also referred to as oxide) 12 on the substrate 10, where substrate 10 may be formed of P type single crystalline silicon. Oxide layer 12 can be formed by deposition or by thermal oxidation. A layer of silicon nitride 14 (also referred to as nitride) is formed on oxide layer 12. A photolithography masking process is then used to pattern the nitride layer 14 and oxide layer 12 (i.e. selectively remove some portions of the layers but not others). The photolithography masking process includes coating photoresist material on the nitride layer 14, followed by exposing and developing the photoresist to remove the photoresist material from the memory cell and HV device areas 2/6 while maintaining the photoresist in the logic device area 4. Nitride and oxide etches are respectively used to remove the exposed nitride and oxide layers 14/12 from the memory cell and HV device areas 2/6 leaving the substrate 10 exposed (the photoresist protects these layers from the etches in the logic device area 4). After the remaining photoresist is removed from the logic device area 4, a silicon oxidation alone, or a silicon oxidation in combination with a silicon etch, is used to recess the exposed upper surface of the substrate 10 in the memory cell and HV device areas 2/6. Oxide and nitride layers 12/14 protect the logic device area 4 from this oxidation/etch. The resulting structure after silicon oxide removal in memory cell and HV device areas 2/6 is shown in FIG. 1A, where the upper surface of the substrate 10 in the memory cell and HV device areas 2/6 is recessed below the surface of the substrate 10 in the logic device area 4 by a recess amount R. A non-limiting example of the amount of recess R can include approximately 50 nm.

Nitride and oxide layers 14/12 are removed from the logic device area 4 (e.g. by one or more etches), leaving the surface of the substrate 10 exposed. The upper surface of the substrate 10 at this point is stepped, where the portions of the upper surface of the substrate 10 in the memory cell and HV device areas 2/6 are recessed (i.e., lower) relative to the portion of the upper surface of the substrate 10 in the logic device area 4 by recess R. An oxide layer 16 is then formed on the surface of the substrate 10 in all three areas 2/4/6, followed by the formation of a polysilicon (also referred to as poly) layer 18 by a first polysilicon deposition on oxide layer 16. The polysilicon layer 18 is then removed from logic device area 4 by chemical mechanical polish (or by chemical etch through a photoresist mask operation that protects memory cell and HV device areas 2/6), while maintaining the polysilicon layer 18 in the memory cell and HV device areas 2/6, as illustrated in FIG. 1B. The polysilicon layer 18 will eventually be used to form the floating gates of the memory cells in memory cell area 2.

An oxide layer 20 is formed over the structure, and a nitride layer 22 is formed on the oxide layer 20. Next, the structure is covered with photoresist, which is exposed and developed to selectively remove the photoresist from portions of the memory cell area 2 and HV device area 6, leaving selected portions of nitride layer 22 exposed. One or more etches are performed to form trenches through the exposed portions of nitride layer 22, and through the underlying portions of oxide layer 20, polysilicon layer 18, oxide layer 16 and into the substrate 10 (where the trenches divide polysilicon layer 18 into strips of polysilicon in the memory cell and HV device areas 2/6), leaving trenches 10b extending into substrate 10 in both the memory cell and HV device areas 2/6. After the photoresist is removed, the structure is covered in a thick layer of insulation material such as oxide (i.e., STI oxide) 24 (filling the trenches 10b with oxide), which is then planarized (e.g., by chemical mechanical polish—CMP) to expose the top surface of nitride layer 22 in the logic area 4. The resulting structure is shown in FIG. 1C.

Oxide spacers 26 are formed on the nitride layer 22 in the logic device area 4, as shown in FIG. 1D. Oxide spacers 26 can be formed by depositing a layer of material (e.g., amorphous carbon) on the structure. The layer of material is patterned by forming photoresist, selectively removing strips of the photoresist in the logic device area 4, and removing the underlying exposed portions of the layer of material to form trenches in the layer of material in the logic device area 4 that extend down to and expose the underlying nitride layer 22. Oxide spacers 26 are then formed in the trenches. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, oxide spacers 26 are formed along the sidewalls of trenches in the layer of material. The remaining portions of layer of material are then removed by an etch, resulting in the structure shown in FIG. 1D.

Next, the structure is covered with photoresist, which is exposed and developed to remove the photoresist from the logic device area 4. A nitride etch is then used to remove the exposed portions of nitride layer 22, followed by an oxide etch to remove exposed portions of oxide layers 16/20, in the logic device area 4. A silicon etch is then used to recess the exposed surface of the substrate 10 in the logic device area 4, forming upwardly extending fins of silicon 10a of the silicon substrate 10. The resulting structure is shown in FIG. 1E.

The structure is covered in a thick layer of insulation material such as oxide (i.e., STI oxide) 30, which is then planarized (e.g., by chemical mechanical polish—CMP) to expose the top surface of nitride layer 22. An etch is used to remove the exposed nitride layer 22, as shown in FIG. 1F. One or more etches can be performed to remove oxide layer 20 from the memory cell area 2 (exposing polysilicon layer 18), and to selectively recess oxide layers 24 and 30 in the memory cell, logic device and HV device areas 2/4/6 (including recessing oxide 24 between the strips of polysilicon layer 18 in the memory cell area 2). An insulation layer 32, which can contain three sublayers of a first oxide, nitride and a second oxide (e.g., an ONO layer) is formed over the structure. A polysilicon layer 34 is formed on the insulation layer 32 by a second polysilicon deposition (i.e., a different polysilicon deposition than the first polysilicon deposition). An oxide layer 35 is formed on the polysilicon layer 34, and a hard mask layer (e.g., nitride) 36 is formed on oxide layer 35. The resulting structure is shown in FIG. 1G.

Photoresist is formed over the structure, and partially removed to expose the HV device area 6 and portions of the memory cell area 2, leaving portions of the hard mask layer 36 exposed. A nitride etch is used to remove the exposed portions of hard mask layer 36, exposing portions of oxide layer 35 which are removed by etch to expose portions of polysilicon layer 34. A polysilicon etch is used to remove the exposed portions of polysilicon layer 34, exposing portions of the insulation layer 32. An etch is used to remove the exposed portions of insulation layer 32, exposing portions of the polysilicon layer 18. Oxide spacers 38 are then formed by oxide deposition and anisotropic etch. A polysilicon etch is then used to remove the exposed portions of polysilicon layer 18. The resulting structure is shown in FIG. 1H, where strips of polysilicon layer 18 remain in the memory cell area 2.

Photoresist is formed over the structure, and partially removed to expose portions of the memory cell area 2 (adjacent the ends of the polysilicon layer strips 18). An implantation is then performed to form source regions 40 (also referred to herein as first source regions) in the memory cell area 2 of the substrate underneath where the photoresist was removed. After photoresist removal, a layer of oxide (tunnel oxide) 42 is formed on the exposed ends of the polysilicon layer strips 18 (e.g., by high temperature oxidation—HTO). A polysilicon layer 44 is then formed over the structure by a third polysilicon deposition (i.e., a different polysilicon deposition than the first and second polysilicon depositions). The polysilicon layer 44 is planarized by CMP, and further etched with a polysilicon etch back, leaving blocks of the polysilicon layer 44 extending over the source regions 40 and along oxide layer 42 in the memory cell area 2, and leaving blocks of the polysilicon layer 44 in the HV device area 6. After removal of hard mask layer 36 by an etch, the structure is covered with a layer of oxide 46. The resulting structure is shown in FIG. 1I.

Photoresist is formed over the structure, and partially removed to expose portions of the oxide layer 46 in memory cell area 2 (i.e., over center portions of the polysilicon strips 18). An oxide etch is used to remove the exposed portions of oxide layer 46, exposing portions of polysilicon layer 34. A polysilicon etch is used to remove the exposed portions of polysilicon layer 34, exposing portions of insulation layer 32. An etch (e.g., oxide, nitride, oxide etches) is used to remove the exposed portions of insulation layer 32, exposing center portions of polysilicon strips 18. A polysilicon etch is used to remove the center portions of polysilicon strips 18. The resulting structure is shown in FIG. 1J (after photoresist removal).

Oxide spacers 47 are formed on the exposed sidewalls of polysilicon layers 18 and 34 in the memory cell area 2 by oxide deposition and anisotropic etch. Photoresist is formed over the structure, and partially removed to expose logic area 4. Etches are used to remove oxide layer 46, polysilicon layer 34, insulation layer 32, and an upper portion of oxide 30 to expose top portions of fins 10a (i.e., so that fins of silicon 10a protrude out from the recessed top surface of oxide layer 30). The resulting structure is shown in FIG. 1K (after photoresist removal).

An oxide layer 49 is formed on the structure including on fins 10a and the substrate surface between source regions 40. A dummy polysilicon layer 50 is formed on the oxide layer 49 by a fourth polysilicon deposition (i.e., a different polysilicon deposition than the first, second and third polysilicon depositions). The dummy polysilicon layer 50 is then planarized using CMP to remove the portions of dummy polysilicon layer 50 over oxide 46, where portions of dummy polysilicon layer 50 remain in the memory cell and logic device areas 2/4 as shown in FIG. 1L.

One or more hard mask layers are then formed on the structure. For example, an amorphous carbon layer 52 is formed on the structure, and an oxide layer 54 is formed on amorphous carbon layer 52. Photoresist is formed on oxide layer 54, and partially removed to expose portions of the oxide layer 54 in the memory cell and logic device areas 2/4. An oxide etch is used to remove the exposed portions of oxide layer 54, exposing portions of amorphous carbon layer 52. A carbon etch is used to remove the exposed portions of amorphous carbon layer 52, exposing portions of dummy polysilicon layer 50. A polysilicon etch is used to remove exposed portions of dummy polysilicon layer 50. This series of etches results in a trench 56 extending through dummy polysilicon layer 50 in the memory cell area 2, and leaving a strip of dummy polysilicon layer 50 extending over and between fins of silicon 10a in the logic device area 4. The resulting structure is shown in FIG. 1M (after photoresist removal).

Photoresist is again formed on the structure, and partially removed to expose portions of the oxide layer 54 in the HV device area 6 (while leaving memory cell and logic device areas 2/4 covered). An oxide etch is used to remove the exposed portions of oxide layer 54 (in the HV device area 6), exposing portions of amorphous carbon layer 52. A carbon etch is used to remove the exposed portions of amorphous carbon layer 52, exposing portions of oxide layer 46. An oxide etch is used to remove the exposed portions of oxide layer 46, exposing portions of polysilicon layer 44. A polysilicon etch is used to remove exposed portions of polysilicon layer 44. This series of etches results in a block of the polysilicon layer 44 remaining in the HV device area 6. The resulting structure is shown in FIG. 1N (after photoresist removal).

Photoresist is formed on the structure, and partially removed to expose the oxide 49 on the substrate surface adjacent blocks of dummy polysilicon layer 50 (at the bottom of trench 56 of FIG. 1N) in the memory cell area 2. An LDD (lightly doped drain) implant is performed to start the formation of drain region 60 in the substrate 10 at the bottom of trench 56 in the memory cell area 2 (i.e., between blocks of dummy polysilicon layer 50). After photoresist removal, nitride spacers 58 are formed on the exposed sidewalls of dummy polysilicon layer 50 and polysilicon layer 44 by nitride deposition and anisotropic etch, as shown in FIG. 1O.

Photoresist is formed on the structure, and partially removed to expose the oxide 49 on the substrate surface adjacent blocks of dummy polysilicon layer 50 (at the bottom of trench 56 of FIG. 1M) in the memory cell area 2, and adjacent the block of polysilicon layer 44 in the HV device area 6. An n-type implantation is then used to further form n-type drain region 60 in the substrate 10 at the bottom of trench 56 in the memory cell area 2 (i.e., between blocks of dummy polysilicon layer 50) (also referred to herein as first drain region), and n-type source-drain regions 62/64 in the substrate 10 on opposite sides of blocks of polysilicon layer 44 in the HV device area 6 (also referred to herein as third source regions and third drain regions). For simplicity, only n-type transistors are shown in the drawings, but p-type transistors can also be formed simultaneously on the same substrate. Therefore, after removal of photoresist, similar photoresist patterning/p-type implantation/photoresist strip sequence is performed to form p-type source-drain regions 62/64 in the HV device areas 6 (also referred to herein as third source regions and third drain regions). The oxide on the fins 10a in logic device area 4 is removed by an etch, and an epitaxial growth followed by n-type implant are performed to form n-type epitaxial source/drain regions 66/68 in the fins 10a on either side of the remaining strip of dummy polysilicon layer 50 for n-type logic devices in the logic device area 4 (also referred to herein as second source regions and second drain regions). Similar photoresist patterning/hard mask etch/photoresist strip/epitaxial growth/p-type implant sequence is used to form p-type epitaxial source-drain regions 66/68 for p-type devices in logic device area 4 (also referred to herein as second source regions and second drain regions). The resulting structure is shown in FIG. 1P.

Exposed portions of oxide layer 49, oxide layer 54, and amorphous carbon layer 52 are next removed by etch. A nitride layer 70 is formed on the structure, and a thick oxide layer 72 is formed on nitride layer 70. A chemical mechanical polish is used to planarize oxide layer 72, using nitride layer 70 as the polish stop. Nitride layer 70 is then selectively removed by chemical mechanical polishing over the strips of dummy polysilicon layer 50/34 in the memory cell area 2 and in logic device area 4 using oxide layers 46 and 72 as etch-stop layers. A selective poly etch is used to remove the exposed strips of dummy polysilicon layer 50 in the memory cell area 2 (also referred to herein as first blocks of polysilicon) and logic device area 4 (also referred to herein as second blocks of polysilicon), and the strips of polysilicon layer 34 in the memory cell area 2 (also referred to herein as third blocks of polysilicon). A layer of oxide 74 is formed on the silicon substrate 10 where the strips of dummy polysilicon layer 50 were removed. A layer of high K material 76 (i.e. having a dielectric constant K greater than that of oxide, such as HfO2, ZrO2, TiO2, Ta2O5, or other adequate materials) is formed on the structure. One or more metal layers are then formed on the structure. For example, a TiN layer 77 is formed on the structure, followed by a thick layer of tungsten 78, followed by CMP, leaving strips of metal 77/78 on high K material 76 in the memory cell and logic device areas 2/4 (effectively replacing dummy polysilicon strips 50 and polysilicon layer strips 34 previously removed), as shown in FIG. 1Q.

A nitride layer 80 is formed over the structure, and an oxide layer 82 is formed on nitride layer 80. Photoresist is formed over the structure, with portions over the source region 60 in the memory cell area 2, over source/drain regions 66/68 in the logic device area 4, and over source/drain regions 62/64 in the HV device area 6, removed, leaving openings that expose portions of oxide layer 82. One or more etches are used to form contact holes through the openings that extend down to and expose source region 60, source/drain regions 66/68, and source/drain regions 62/64. The contact holes are filled with conductive material (e.g. TiN/Tungsten) to form conductive contacts 84. The resulting structure is shown in FIG. 1R (after photoresist removal).

Figure 2:
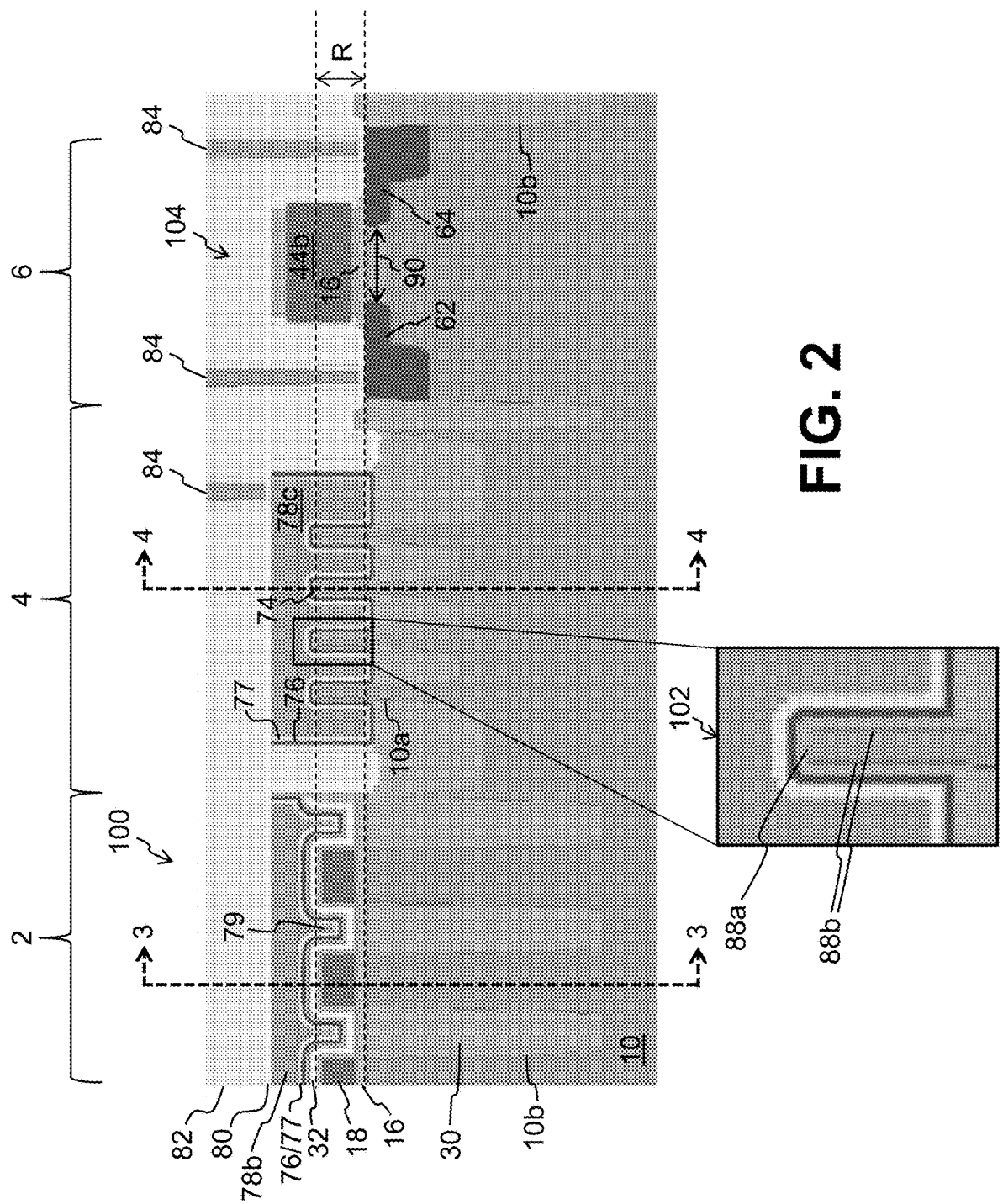
FIG. 2 is a side cross sectional view of memory cells in the memory cell area, logic devices in the logic device area and an HV device in the HV device area of the semiconductor substrate.
Figure 3:
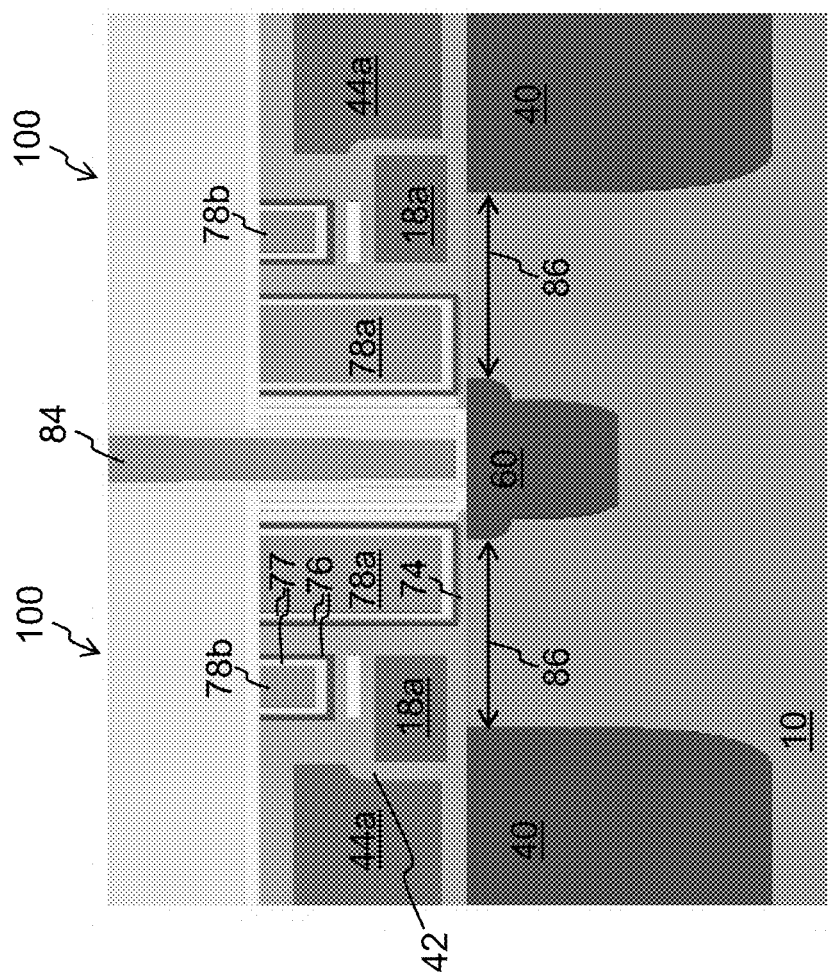
FIG. 3 is a side cross sectional view of the memory cells in the memory cell area of the semiconductor substrate.

FIGS. 2 and 3 are cross sectional views showing the memory cells 100 formed in the memory cell area 2. Respective memory cells 100 include respective source and drain regions 40 and 60 that define a planar channel region 86 in the substrate there between (also referred to herein as first channel region). Floating gate 18a is polysilicon and is disposed over and controls the conductivity of a first portion of the channel region 86, and the metal word line (select) gate 78a (also referred to herein as the first block of metal) is disposed over and controls the conductivity of a second portion of the channel region 86. The metal control gate 78b is disposed over the floating gate 18a, and the polysilicon erase gate 44a is disposed over the source region 40. The erase gate 44a can have a notch or concavity that faces an edge of the floating gate 18a for enhanced tunneling performance through the intervening tunnel oxide layer 42. The memory cells 100 are formed in pairs end to end, where each memory cell pair shares a common drain region 60, and adjacent pairs of memory cells share a common erase gate 44a and source region 40.

Figure 4:
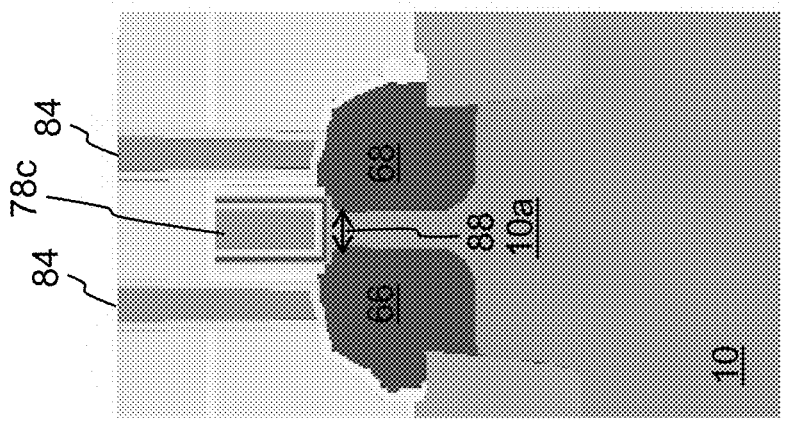
FIG. 4 is a side cross sectional view of the logic devices in the logic device area of the semiconductor substrate.

FIGS. 2 and 4 are cross sectional views of the logic devices 102 formed in the logic device area 4. Each logic device 102 includes source and drain regions 66 and 68 that define a channel region 88 in the substrate fin 10a there between (also referred to herein as second channel region). Each fin of silicon 10a includes a pair of side surfaces extending up and terminating at a top surface. As best shown in FIG. 2, channel region 88 includes a top surface portion 88a extending along the top of the fin structure 10a, and side surface portions 88b extending along the sides of the fin structure 10a. The logic gate 78c (also referred to herein as the second block of metal) is disposed over the top surface portion of the channel region 88a, and laterally adjacent to the side surface portions of the channel region 88b (i.e., logic gate 78c wraps around the top and side surface portions 88a/88b of fin 10a), for controlling the conductivity of the channel region 88.

FIG. 2 includes a cross sectional view of the HV device 104 (also referred to herein as a high voltage device) formed in the HV device area 6. For the purposes of this disclosure, a high voltage device is one having an operating voltage that is greater than that of the logic device 102. Each HV device includes source and drain regions 62 and 64 that define a planar channel region 90 in the substrate there between (also referred to herein as third channel region). The HV gate 44b (also referred to herein as device gate) is disposed over and controls the conductivity of channel region 90.

While two memory cells 100, four logic devices 102 and one HV device 104 are shown in FIG. 2, one skilled in the art would appreciate that many devices of each type are simultaneously formed in their respective areas 2/4/6.

The above described memory device method and resulting structure provide many advantages, including the advantages of high operational performance and ease of manufacturing of planar memory cells 100 (i.e. memory cells that are formed on a planar region of the substrate) and planar HV devices 104 (i.e., devices that are formed on a planar region of the substrate) with the advantages of advanced combinations of embedded logic and memory devices where the logic devices 102 are condensed, non-planar logic devices (i.e., logic devices that are formed on and surrounding silicon fin structures). The FinFET transistor architecture of the logic devices 102 provides enhanced channel control with a tri-gate configuration and enables further scaling of the transistor dimensions.

Another advantage is that the upper surface of substrate 10 is recessed in the memory cell and HV device areas 2/6 relative to the logic device area 4. Specifically, the planar surfaces of the substrate 10 which constitute the channel regions in the memory cell and HV device areas 2/6 have a height that is recessed below the tops of the fins 10a in the logic device area 4 by a recess amount R as shown in FIG. 2, which accommodates the higher gate stack thickness and topology of the memory cell and HV devices 100/104 relative to the logic devices 102. Additionally, common processing in the logic device area 4 and the memory cell and HV device areas 2/6 is facilitated. For example, having fins 10a in the logic device area 4 rising above the height of the substrate surface in the memory cell area 2 simplifies the common formation steps of blocks of dummy polysilicon layer 50, oxide layer 74, high K layer 76, TiN layer 77 and blocks of tungsten 78 in both regions, where the resulting metal gates 78a having a planar bottom surface are formed for the memory cells using the same formation steps that are used to form metal gates 78c having a bottom surface wrapping around the fins 10a for the logic devices 102. Similarly, a common implantation operation forms the memory cell drain regions 60 and HV device source/drain regions 62/64. Further, the erase gates 44a and HV gates 44b are formed using the same polysilicon deposition processing, and word line gates 78a, control gates 78b and logic gates 78c are formed using the same metal deposition processing. Control gates 78b can be made thinner without compromising low resistivity given their highly conductive metal composition. Control gates 78b are formed as continuous lines extending across multiple active regions, with a bottom surface portion 79 that extends down between adjacent floating gate 18 for better capacitive coupling (e.g., as best shown in FIG. 2, the control gate 78b has a first portion vertically over the floating gate 18, and a second portion 79 laterally adjacent to the floating gate 18 which results from recessing the STI oxide 24 between the floating gates 18 before the insulation layer 32 and polysilicon layer 34 are formed.

Still another advantage is the combination of polysilicon material for the HV gate 44b, floating gate 18a, and erase gate 44a (for ease of manufacture, and better control of tunneling between the floating and erase gates 18a/44a) and metal material insulated by a high K material for the word line gates 78a, control gates 78b and logic gates 78c (for enhanced conductivity and performance). Dummy polysilicon layer 50 is used to form dummy gates in the memory cell and logic areas 2/4, which are removed and replaced with metal word line gates 78a and control gates 78b for the memory cells and logic gates 78c for the logic devices. A majority of the process fabrication for the memory cells and HV devices (including the formation of all the polysilicon gates for the memory cells and HV devices) is performed before the formation of the logic gates, which reduces processing impacts on the CMOS baseline. Finally, improved combinations of insulation between various components is achieved. Specifically, the word line gate is insulated from the second portion of the first channel region by at least the layer of high K material, and the logic gate is insulated from the second channel region by at least the layer of high K material, and the control gate is insulated from the floating gate by at least the layer of high K material. Additionally, the word line gate is further insulated from the second portion of the first channel region by an oxide layer, and the logic gate is further insulated from the second channel region by the oxide layer. Finally, the control gate is further insulated from the floating gate by an insulation layer that comprises a first oxide, a nitride and a second oxide sublayers.

It is to be understood that the present disclosure is not limited to the example(s) described above and illustrated herein. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or recited in the claims, but rather in any order (unless there is an explicitly recited limitation on any order) that allows the proper formation of the memory cells and logic devices described herein. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a device, comprising:
providing a substrate of silicon having first, second and third areas;

recessing an upper surface of the substrate in the first area and an upper surface of the substrate in third area, relative to an upper surface of the substrate in the second area;

removing portions of the substrate in the second area to form an upwardly extending fin of silicon having a pair of side surfaces extending up and terminating at a top surface;

forming a first source region and a first drain region in the first area, wherein the first source region and the first drain region define a first channel region of the substrate extending therebetween;

forming a second source region and a second drain region in the fin of silicon to define a second channel region of the substrate extending therebetween along the top surface and the pair of side surfaces of the fin of silicon;

forming a third source region and a third drain region in the third area, wherein the third source region and the third drain region define a third channel region of the substrate extending therebetween;

forming a floating gate disposed over and insulated from a first portion of the first channel region of the substrate using a first polysilicon deposition;

forming an erase gate disposed over and insulated from the first source region and a device gate disposed over and insulated from the third channel region of the substrate using a second polysilicon deposition different from the first polysilicon deposition; and forming a word line gate disposed over and insulated from a second portion of the first channel region, a control gate disposed over and insulated from the floating gate, and a logic gate disposed over and insulated from the second channel region of the substrate, using a metal deposition;

wherein the removing of the portions of the substrate to form the fin of silicon is performed after the recessing wherein after the recessing and before the removing, the method further comprising:
  forming trenches extending into the substrate in the first and third areas;
  forming insulation material in the first and third areas; and
  planarizing an upper surface of the insulation material;
  wherein the trenches are filled with the insulation material after the planarizing.

2. The method of claim 1, wherein the control gate has a first portion disposed vertically over the floating gate, and a second portion disposed laterally adjacent to the floating gate.

3. The method of claim 1, wherein the control gate is disposed vertically over and insulated from a top surface of the floating gate, and is disposed laterally adjacent to and insulated from a pair of side surfaces of the floating gate, such that the control gate wraps around the top surface and the pair of side surfaces of the floating gate.

4. The method of claim 1, wherein the removing of the portions of the substrate to form the fin of silicon is performed before the forming of the control gate, the erase gate, the device gate, the word line gate and the logic gate.

5. The method of claim 1, wherein the removing of the portions of the substrate in the second area to form the fin of silicon comprises:
  forming a layer of first material over the second area;
  forming trenches in the first material;
  forming spacers of second material along sidewalls of the trenches in the first material;
  removing the first material; and
  performing an etch of the substrate around the spacers of the second material to form the fin of silicon.

6. The method of claim 1, wherein the logic gate is disposed vertically over and insulated from the top surface of the fin of silicon, and is disposed laterally adjacent to and insulated from the pair of side surfaces of the fin of silicon, such that the logic gate wraps around the top surface and the pair of side surfaces of the fin of silicon.

7. The method of claim 1, wherein the forming of the word line gate and the logic gate comprises:
  performing a third polysilicon deposition, different from the first and second polysilicon depositions, to form a first block of polysilicon material over and insulated from the second portion of the first channel region and a second block of polysilicon material over and insulated from the second channel region;
  replacing the first block of polysilicon material with a first block of metal using a polysilicon etch and the metal deposition; and
  replacing the second block of polysilicon material with a second block of metal using the polysilicon etch and the metal deposition.

8. The method of claim 7, wherein:
the replacing the first block of polysilicon material comprises forming a layer of high K material under the first block of metal; and
the replacing the second block of polysilicon material comprises forming the layer of high K material under the second block of metal.

9. A method of forming a device, comprising:
providing a substrate of silicon having first, second and third areas;
recessing an upper surface of the substrate in the first area and an upper surface of the substrate in third area, relative to an upper surface of the substrate in the second area;
removing portions of the substrate in the second area to form an upwardly extending fin of silicon having a pair of side surfaces extending up and terminating at a top surface;
forming a first source region and a first drain region in the first area, wherein the first source region and the first drain region define a first channel region of the substrate extending therebetween;
forming a second source region and a second drain region in the fin of silicon to define a second channel region of the substrate extending therebetween along the top surface and the pair of side surfaces of the fin of silicon;
forming a third source region and a third drain region in the third area, wherein the third source region and the third drain region define a third channel region of the substrate extending therebetween;
forming a floating gate disposed over and insulated from a first portion of the first channel region of the substrate using a first polysilicon deposition;
forming an erase gate disposed over and insulated from the first source region and a device gate disposed over and insulated from the third channel region of the substrate using a second polysilicon deposition different from the first polysilicon deposition; and
forming a word line gate disposed over and insulated from a second portion of the first channel region, a control gate disposed over and insulated from the floating gate, and a logic gate disposed over and insulated from the second channel region of the substrate, using a metal deposition;

wherein the word line gate is insulated from the second portion of the first channel region by at least a layer of high K material, and the logic gate is insulated from the second channel region by at least the layer of high K material, and the control gate is insulated from the floating gate by at least the layer of high K material.

10. The method of claim 9, wherein the word line gate is further insulated from the second portion of the first channel region by an oxide layer, and the logic gate is further insulated from the second channel region by the oxide layer.

11. The method of claim 9, wherein the control gate is further insulated from the floating gate by an insulation layer that comprises a first oxide, a nitride and a second oxide sublayers.

12. A method of forming a device, comprising:
providing a substrate of silicon having first, second and third areas;
recessing an upper surface of the substrate in the first area and an upper surface of the substrate in third area, relative to an upper surface of the substrate in the second area;
removing portions of the substrate in the second area to form an upwardly extending fin of silicon having a pair of side surfaces extending up and terminating at a top surface;
forming a first source region and a first drain region in the first area, wherein the first source region and the first drain region define a first channel region of the substrate extending therebetween;
forming a second source region and a second drain region in the fin of silicon to define a second channel region of the substrate extending therebetween along the top surface and the pair of side surfaces of the fin of silicon;
forming a third source region and a third drain region in the third area, wherein the third source region and the third drain region define a third channel region of the substrate extending therebetween;
forming a floating gate disposed over and insulated from a first portion of the first channel region of the substrate using a first polysilicon deposition;
forming an erase gate disposed over and insulated from the first source region and a device gate disposed over and insulated from the third channel region of the substrate using a second polysilicon deposition different from the first polysilicon deposition; and
forming a word line gate disposed over and insulated from a second portion of the first channel region, a control gate disposed over and insulated from the floating gate, and a logic gate disposed over and insulated from the second channel region of the substrate, using a metal deposition:
wherein the forming of the word line gate and the logic gate comprises:
performing a third polysilicon deposition, different from the first and second polysilicon depositions, to form a first block of polysilicon material over and insulated from the second portion of the first channel region and a second block of polysilicon material over and insulated from the second channel region;
replacing the first block of polysilicon material with a first block of metal using a polysilicon etch and the metal deposition; and
replacing the second block of polysilicon material with a second block of metal using the polysilicon etch and the metal deposition;
wherein the forming of the control gate comprises:
performing a fourth polysilicon deposition, different from the first, second and third polysilicon depositions, to form a third block of polysilicon disposed over and insulated from the floating gate; and
replacing the third block of polysilicon with a third block of metal using the polysilicon etch and the metal deposition.

13. The method of claim 12, wherein:
the replacing the third block of polysilicon comprises forming a layer of high K material under the third block of metal.

14. A The device, comprising:
a substrate of silicon having first, second and third areas, wherein:
an upper surface in the first area is planar,
an upper surface in the third area is planar,
an upper surface in the second area includes an upwardly extending fin of silicon that includes a pair of side surfaces extending up and terminating at a top surface, and
the upper surface in the first area and the upper surface in the third area are recessed below the top surface of the fin of silicon;
a memory cell in the first area, comprising:
first source and first drain regions formed in the first area with a first channel region of the substrate extending therebetween,
a floating gate of polysilicon disposed over and insulated from a first portion of the first channel region,
a word line gate of metal disposed over and insulated from a second portion of the first channel region,
a control gate of metal disposed vertically over and insulated from a top surface of the floating gate, the control gate of metal is disposed laterally adjacent to and insulated from a pair of side surfaces of the floating gate, such that the control gate of metal wraps around the top surface and the pair of side surfaces of the floating gate, and
an erase gate of polysilicon disposed over and insulated from the first source region;
a high voltage device in the third area, comprising:
third source and third drain regions formed in the third area with a third channel region of the substrate extending therebetween, and
a device gate of polysilicon disposed over and insulated from the third channel region; and
a logic device in the second area, comprising:
second source and second drain regions formed in the fin of silicon with a second channel region of the substrate extending therebetween along the top surface and the pair of side surfaces of the fin of silicon, and
a logic gate disposed vertically over and insulated from the top surface of the fin of silicon, the logic gate disposed laterally adjacent to and insulated from the pair of side surfaces of the fin of silicon, such that the logic gate wraps around the top surface and the pair of side surfaces of the fin of silicon;
wherein the word line gate is insulated from the second portion of the first channel region by at least a layer of high K material, and the logic gate is insulated from the second channel region by at least the layer of high K material, and the control gate is insulated from the floating gate by at least the layer of high K material.

15. The device of claim 14, wherein the word line gate is further insulated from the second portion of the first channel region by an oxide layer, and the logic gate is further insulated from the second channel region by the oxide layer.

16. The device of claim 14, wherein the control gate is further insulated from the floating gate by an insulation layer that comprises a first oxide, a nitride and a second oxide sublayers.

\* \* \* \* \*